United States Patent
Zhuo et al.

(10) Patent No.: US 7,769,361 B2
(45) Date of Patent: Aug. 3, 2010

(54) SYSTEMS, METHODS, AND APPARATUS FOR FREQUENCY CONVERSION

(75) Inventors: Wei Zhuo, San Diego, CA (US); Solti Peng, Plano, TX (US)

(73) Assignee: QUALCOMM Incorporated, San Diego, CA (US)

( * ) Notice: Subject to any disclaimer, the term of this patent is extended or adjusted under 35 U.S.C. 154(b) by 591 days.

(21) Appl. No.: 11/531,755

(22) Filed: Sep. 14, 2006

(65) Prior Publication Data

US 2008/0020728 A1 Jan. 24, 2008

Related U.S. Application Data

(60) Provisional application No. 60/832,077, filed on Jul. 19, 2006.

(51) Int. Cl.
*H04B 1/28* (2006.01)
(52) U.S. Cl. .................... 455/324; 455/333
(58) Field of Classification Search ............ 455/118, 455/313, 323, 326, 333, 324; 327/113
See application file for complete search history.

(56) References Cited

U.S. PATENT DOCUMENTS

| | | | | |
|---|---|---|---|---|
| 5,826,182 | A | 10/1998 | Gilbert | 455/326 |
| 6,512,408 | B2 | 1/2003 | Lee | 327/359 |
| 6,639,447 | B2 | 10/2003 | Manku et al. | |
| 6,704,559 | B1 | 3/2004 | Hageraats | 455/326 |
| 2002/0094037 | A1 | 7/2002 | Darabi | 375/316 |
| 2003/0162515 | A1 | 8/2003 | Zhou | 455/189.1 |
| 2003/0216128 | A1 | 11/2003 | Zhou | 455/127.1 |
| 2004/0063418 | A1 | 4/2004 | Kluge | 455/315 |
| 2004/0121751 | A1 | 6/2004 | Shen | 455/313 |
| 2004/0259519 | A1 | 12/2004 | Su | 455/326 |
| 2005/0124311 | A1 | 6/2005 | Mahmoudi | 455/323 |
| 2005/0180528 | A1 | 8/2005 | Manku | 375/316 |
| 2005/0197090 | A1 | 9/2005 | Stockstad | 455/313 |
| 2005/0272398 | A1 | 12/2005 | Chang | 455/326 |
| 2006/0006921 | A1 | 1/2006 | Tenbroek | 327/359 |
| 2006/0014509 | A1 | 1/2006 | Xu | 455/255 |
| 2006/0022740 | A1 | 2/2006 | Kim | 327/359 |
| 2006/0091944 | A1 | 5/2006 | Kim et al. | |
| 2007/0264960 | A1* | 11/2007 | Lin et al. | 455/323 |
| 2008/0014896 | A1* | 1/2008 | Zhuo et al. | 455/326 |

OTHER PUBLICATIONS

Chehrazi, S. et al. Noise in Passive FET Mixers: A Simple Physical Model. IEEE 2004 Custom Integrated Circuits Conf., pp. 375-378.
Cheung, V. et al. A 1-V 10-mW Monolithic Bluetooth Receiver in a 0.35-µm CMOS Process. Euro. Solid-State Circs. Conf. (ESSCIRC), Portugal, Sep. 2003. 4 pp.
Darabi, H. et al. Noise in RF-CMOS Mixers: A Simple Physical Model. IEEE Trans. Solid-State Circ., vol. 35, No. 1, Jan. 2000, pp. 15-25.

(Continued)

*Primary Examiner*—Nguyen Vo
(74) *Attorney, Agent, or Firm*—Jiayu Xu

(57) ABSTRACT

A frequency converter according to one embodiment includes a quadrature pair of passive mixers whose input terminals are coupled to a differential radio-frequency input via the channel regions of transistors that are arranged to operate in the saturation region.

38 Claims, 20 Drawing Sheets

OTHER PUBLICATIONS

Gao, J. et al. Study of Flicker Noise for Zero-IF Receiver. Progress in Electromagnetic Research Symposium 2005, Hangzhou, CN, Aug. 22-26. pp. 1-4.

Gudem, P. and Larson, L. ECE265B, Mixer, Part 1, UCSD. Last accessed Jun. 30, 2006 at http://ece-classweb.ucsd.edu:16080/winter06/ece265b/ECE265BMixer_Part_1.pdf. 54 pp.

Institute of Microelectronic Systems (MES). Darmstadt Univ. of Technology, DE. Lecture 9: Mixers. CMOS RFIC Design. Last accessed Jun. 30, 2006 at http://www.microelectronic.e-technik.tu-darmstadt.de/lectures/summer/rfic/download/lecture9.pdf. 48 pp.

Kawokgy, M. Low-Power Low-Voltage CMOS RF Mixers. Last accessed Jun. 30, 2006 at www.eecg.toronto.edu/~kphang/papers/2001/kawok_mixer.pdf. 12 pp.

Krizhanovskii, V. et al. A Direct Conversion CMOS Front-End for 2.4 GHz Band of IEEE 802.15.4 Standard. IEEE Asian Solid-State Circs. Conf., TW, Nov. 2005, pp. 449-452.

Laferriere, P. et al. A 5GHz direct-conversion receiver with DC offset correction. IEEE ISCAS 2004, pp. 269-272, vol. IV.

Leenaerts, D. et al. 1/f Noise in Passive CMOS Mixers for Low and Zero IF Integrated Receivers. Euro. Solid-State Circs. Conf. (ESSCIRC), Sep. 2001. 27 pp.

Lindfors, S. and Tong, T. Integrated Mixer. Aalborg Univ., DK, 2003 and Oct. 2005. Last accessed Jun. 30, 2006 at http://cpk.auc.dk/risc/lecture/9sem-2005/RISC9-1/mm.5.slides.pdf. 51 pp.

Matsuzawa, A. Mixed Signal Lecture 11: RFCMOS 04, May 10, 2005. Last accessed Jun. 30, 2006 at http://www.ssc.pe.titech.ac.jp/class/handout/Mixed%20signal_Lecture11_RFCMOS_04.pdf. 15 pp.

Nguyen, T.-K. et al. A 900 MHz CMOS RF Direct Conversion Receiver Front-end with 3-dB NF and 30-KHz 1/f Noise Corner. IEEE Asian Solid-State Circs. Conf., TW, Nov. 2005, pp. 349-352.

Niknejad, A. EECS 142 Lecture 20: Passive Mixers. Univ. of CA, Berkeley, 2005. Last accessed Jun. 30, 2006 at rfic.eecs.berkeley.edu/~niknejad/ee142/pdf/lect20.pdf. 32 pp.

Parssinen, A. et al. A 2-GHz Wide-Band Direct Conversion Receiver for WCDMA Applications. IEEE J. Solid-State Circ., vol. 34, No. 12, Dec. 1999, pp. 1893-1903.

Peng, S. et al. A Wide-Band Mixer for WCDMA/CDMA2000 in 90nm Digital CMOS Process. 2005 IEEE RF Integrated Circ. Symp., pp. 179-182.

Phan, A.-T. et al. A Novel 1.5V DC Offset Cancellation CMOS Down Conversion Mixer. IEEE ISCAS 2005, Japan, May 2005, pp. 3704-3707.

Redman-White, W. et al. 1/f Noise in Passive CMOS Mixers for Low and Zero IF Integrated Receivers. Euro. Solid-State Circs. Conf. (ESSCIRC) 2001, AT. 4 pp.

Ryynanen, J. et al. An RF front-end for the direct conversion WCDMA receiver. IEEE RFIC Symposium 1999. 4 pp. (pp. 21-24).

Sacchi, E. et al. High Linearity Downconversion Mixer for GSM-EDGE TX Application. 2001 Berkeley Wireless Research Center Summer Retreat. Last accessed Jun. 30, 2006 at http://bwrc.eecs.berkeley.edu/Presentations/Retreats/Summer_Retreat_June_2001/Posters/RF%20Circuits%20&%20Multimode%20RF/Downconversion%20-%20Enrico%20Sacchi.pdf. 9 pp.

Sanchez-Sinencio, E. ELEN 665: Mixer. Analog and Mixed-Signal Center, Texas A&M Univ. Last accessed Jun. 30, 2006 at http://amesp02.tamu.edu/~sanchez/665%20Mixer.pdf. 44 pp.

Tillman, F. et al. 1 Volt CMOS Bluetooth Front End. Euro. Solid-State Circs. Conf. (ESSCIRC) 2002, pp. 795-798.

Valla, M. et al. A 72-mW CMOS 802.11a Direct Conversion Front-End With 3.5-dB NF and 200-kHz 1/f Noise Corner. IEEE J. Solid-State Circ., vol. 40, No. 4, Apr. 2005, pp. 970-977.

Wang, X. et al. Comparison of the image rejection between the passive and the Gilbert mixer. IEEE ISCAS 2004, pp. 968-971, vol. I.

International Search Report and Written Opinion-PCT/US07/073314, International Search Authority, European Patent Office—Mar. 12, 2008.

Abidi, A. On the Operation of Cascode Gain Stages, IEEE J. Solid-State Circ., vol. 23, No. 6, Dec. 1988, pp. 1434-1437.

* cited by examiner

SYSTEMS, METHODS, AND APPARATUS FOR FREQUENCY CONVERSION

The present Application for Patent claims priority to Provisional Application No. 60/832,077 entitled "SYSTEMS, METHODS, AND APPARATUS FOR FREQUENCY CONVERSION" filed Jul. 19, 2006, and assigned to the assignee hereof and hereby expressly incorporated by reference herein.

FIELD OF THE INVENTION

This invention relates to wireless communications.

BACKGROUND

Many techniques for transferring information from one location to another include one or more frequency conversion operations. In a transmitting application, for example, a signal carrying information may be upconverted into a radio-frequency (RF) signal for transmission over a medium such as a wireless channel or a conductive or optical cable. In a receiving application, an RF signal carrying information may be received from such a medium and downconverted to an intermediate frequency or to baseband for processing and/or demodulation.

Mixers are commonly used to perform frequency conversion operations. In a typical application, a mixer is arranged to multiply a signal at an initial frequency F0 by a local oscillator (LO) signal to obtain components at the sum and difference frequencies. For example, a quadrature mixing operation may be used to obtain two channels that are 90 degrees out of phase according to an expression such as the following:

$$\cos(\omega_{F0}t)\cos(\omega_{LO}t) = \frac{1}{2}(\cos[(\omega_{F0} + \omega_{LO})t] + \cos[(\omega_{F0} - \omega_{LO})t]),$$

$$\cos(\omega_{F0}t)\sin(\omega_{LO}t) = \frac{1}{2}(\sin[(\omega_{F0} + \omega_{LO})t] - \sin[(\omega_{F0} - \omega_{LO})t]).$$

The desired one of the two resulting frequency components in each channel may be selected by bandpass filtering the mixer output if necessary.

In a heterodyne circuit, the intermediate frequency (IF) is significantly different from both baseband and RF, such that the conversion between baseband and RF is typically performed in two or more stages. In a homodyne or "zero-IF" circuit, the frequency of the LO signal is substantially equal to the RF, such that the signal is converted between baseband and RF in one stage. In other techniques that are termed "low-IF" or "near-zero-IF", the IF is close to baseband (e.g., a few hundred kHz or less).

It is desirable to perform frequency conversion such that the level of noise in the converted signal is minimized.

SUMMARY

An apparatus according to one embodiment has a frequency converter that includes a first passive mixer having first and second input terminals; a second passive mixer having first and second input terminals; and first, second, third, and fourth transistors. Each of the four transistors has a gate and a channel region that is proximate to the gate and has two ends. The channel regions of the first and third transistors are coupled in series between the first input terminal of the first passive mixer and the first input terminal of the second passive mixer, and the channel regions of the second and fourth transistors are coupled in series between the second input terminal of the first passive mixer and the second input terminal of the second passive mixer. The first input terminal of the first passive mixer is configured to receive one side of a differential radio-frequency current signal via the channel region of the first transistor, and the second input terminal of the first passive mixer is configured to receive the other side of the differential radio-frequency current signal via the channel region of the second transistor. The first input terminal of the second passive mixer is configured to receive one side of the differential radio-frequency current signal through the channel region of the third transistor, and the second input terminal of the second passive mixer is configured to receive the other side of the differential radio-frequency current signal through the channel region of the fourth transistor.

An apparatus according to another embodiment includes a frequency converter having first and second nodes configured to receive respective sides of a differential radio-frequency current signal. The frequency converter includes a first passive mixer having first and second input terminals; a second passive mixer having first and second input terminals; and first, second, third, and fourth transistors. Each of the four transistors has a gate and a channel region that is proximate to the gate and has two ends. The first input terminal of the first passive mixer is coupled to the first node through the two ends of the channel region of the first transistor, and the second input terminal of the first passive mixer is coupled to the second node through the two ends of the channel region of the first transistor. The first input terminal of the second passive mixer is coupled to the first node through the two ends of the channel region of the third transistor, and the second input terminal of the second passive mixer is coupled to the second node through the two ends of the channel region of the fourth transistor.

A method of frequency conversion according to an embodiment includes receiving, in a first channel (e.g., an in-phase channel), a first side of a differential current signal via the channel region of a first transistor that is biased to operate in the saturation region, and a second side of the differential current signal via the channel region of a second transistor that is biased to operate in the saturation region. The method includes receiving, in a second channel (e.g., a quadrature channel), the first side of the differential current signal via the channel region of a third transistor that is biased to operate in the saturation region, and the second side of the differential current signal via the channel region of a fourth transistor that is biased to operate in the saturation region. The method also includes generating a plurality of local oscillator signals that includes a first LO signal and a second LO signal having a phase difference, with respect to the first LO signal, substantially equal to ninety degrees. The method includes using a passive mixer of the first channel to multiply the received differential current signal by a sequence that alternates, according to a frequency and phase of the first LO signal, between two values of substantially equal amplitude and opposite magnitude; and using a passive mixer of the second channel to multiply the received differential current signal by a sequence that alternates, according to a frequency and phase of the second LO signal, between the two values of substantially equal amplitude and opposite magnitude.

BRIEF DESCRIPTION OF THE DRAWINGS

FIG. 6b shows another schematic diagram of the passive mixer illustrated in FIG. 6a.

DETAILED DESCRIPTION

The term "node" is used herein and in the attached claims to include its ordinary meaning of "a region of a circuit where there is no change in potential." The term "terminal" is used herein and in the attached claims to include its ordinary meaning of a "terminal node" of a circuit, device, or element.

Although for convenience the following description refers principally to applications and devices configured for signal reception, the structures and methods disclosed may also be applied to applications and devices configured for signal transmission, and such application is expressly contemplated and hereby disclosed.

Although the convention of labeling the opposite ends of a mixer as "RF" and "IF" is followed herein, use of the frequency converters and other structures disclosed herein for direct conversion or "zero-IF" applications (i.e., direct conversion between RF and baseband) is expressly contemplated and hereby disclosed. Therefore, it should be understood that the label "IF" as used herein simply indicates a signal at a frequency that is a difference between the RF and LO frequencies, which may be substantially equal to zero (i.e., a baseband signal).

Figure 1A:
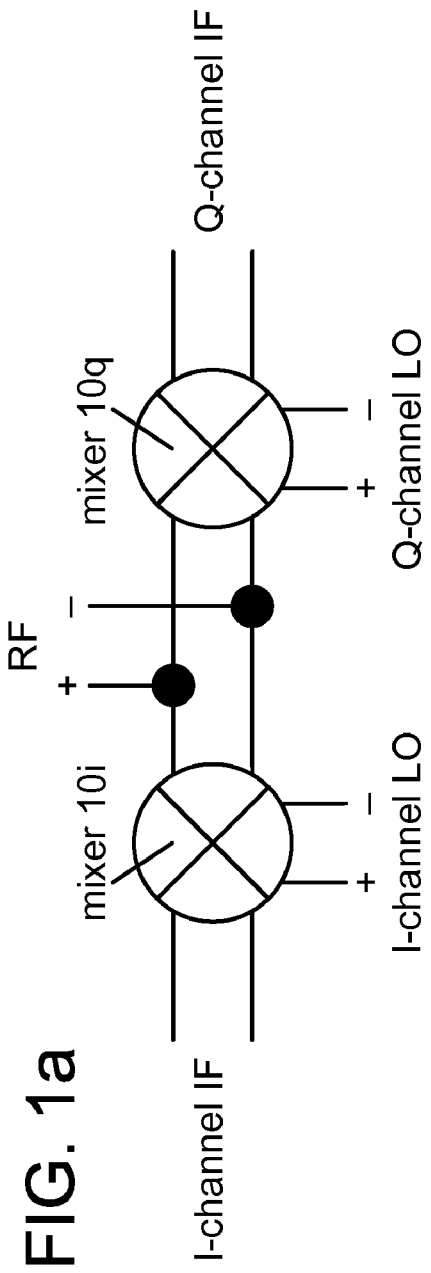
FIG. 1a shows a block diagram of a frequency converter including two mixers.

FIG. 1a shows a block diagram of a frequency converter based on a quadrature mixer architecture that includes two mixers $10i,q$, each coupled to a differential RF input and outputting a respective one of a quadrature pair of IF signals. Mixers may be implemented in various ways. For example, some implementations use transmission line structures, passive components (resistors, capacitors, and/or inductors), and/or diodes. Most mixers, however, are implemented with active devices such as bipolar junction transistors (BJTs) or metal-oxide-semiconductor field-effect transistors (MOSFETs), which may be fabricated to have desirable qualities such as low cost, small feature size, and good reproducibility. A MOSFET includes a gate configured to control current flow across a channel region, which is proximate to and insulated from the gate and has two ends (called "drain" and "source"), one at either side of the gate.

At the present time, mixers are typically implemented as switching mixers. A switching mixer is configured to multiply the RF signal by a sequence that alternates, according to a local oscillator frequency and phase, between two values having substantially equal amplitude and opposite magnitude (e.g., +1 and −1). Such mixers are implemented using devices such as BJTs or MOSFETs that are arranged to switch the two sides of the RF signal between the mixer output terminals.

Figure 1B:
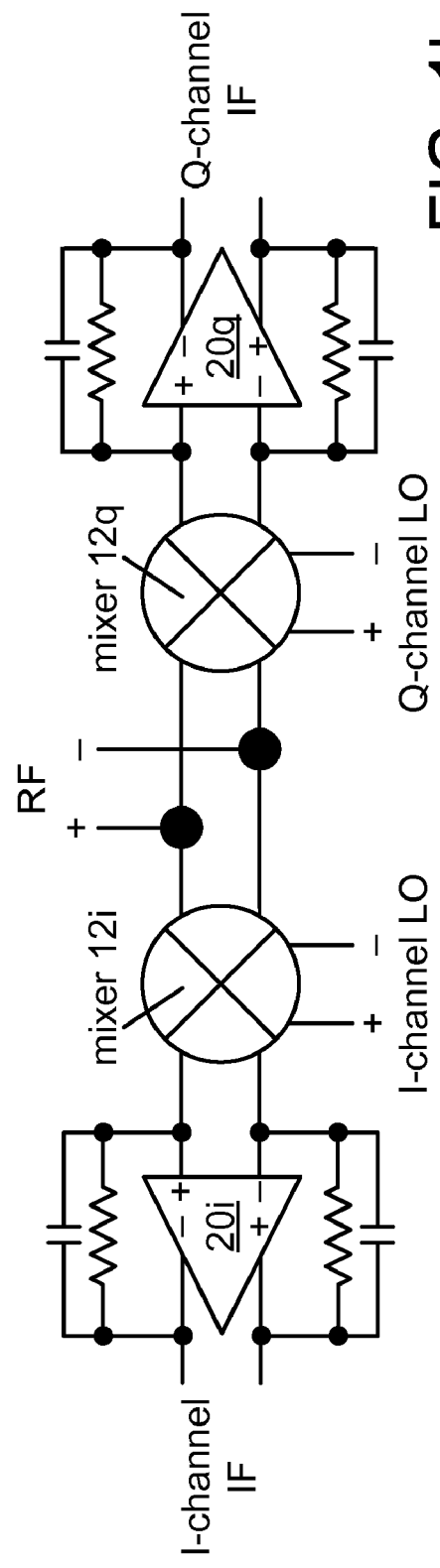
FIG. 1b shows a block diagram of a frequency converter driving transimpedance amplifiers.

A switching mixer architecture may be configured to switch an RF voltage (a "voltage-commutating" architecture) or an RF current (a "current-commutating" architecture). FIG. 1b shows a block diagram of a frequency converter based on a current-commutating quadrature mixer architecture. In this example, the outputs of the switching mixers $12i,q$ drive respective transimpedance amplifiers $20i,q$, implemented here as differential operational amplifiers with feedback, which convert the current signals into voltage signals.

Figures 2A, 2B:
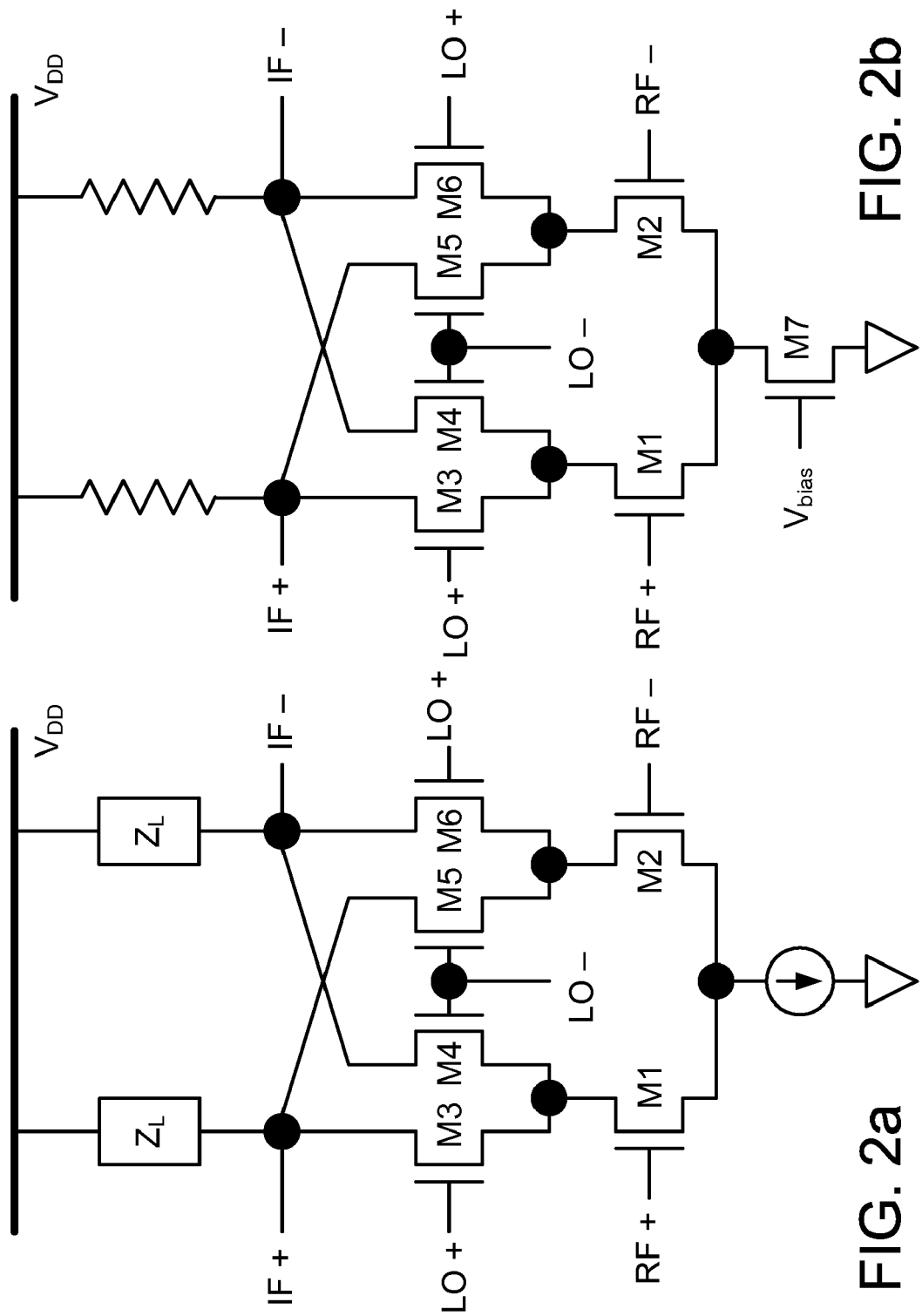
FIG. 2a shows a schematic diagram of an implementation of an active mixer.
FIG. 2b shows a schematic diagram of another implementation of an active mixer.

A switching mixer may be implemented according to an active configuration or a passive configuration. FIG. 2a shows a schematic diagram of one example of a double-balanced active current-commutating mixer circuit, also known as a Gilbert cell. This circuit includes a differential transconductance stage (M1, M2) and a quadrature mixer core (M3-M6). The mixer core includes two differential pairs (M3, M4 and M5, M6) and operates as a fully balanced, phase-reversing current switch. As shown in FIG. 2b, the current source that provides the bias current to be switched may be implemented as an active device M7. Alternatively, the current source may be implemented as an inductor or LC circuit (e.g., a parallel LC tank resonating at the RF frequency). The matched loads $Z_L$ may be implemented as resistors as shown in FIG. 2b. Alternatively, the matched loads may be implemented as or including other passive components, such as inductors, or as active loads.

Figure 3:
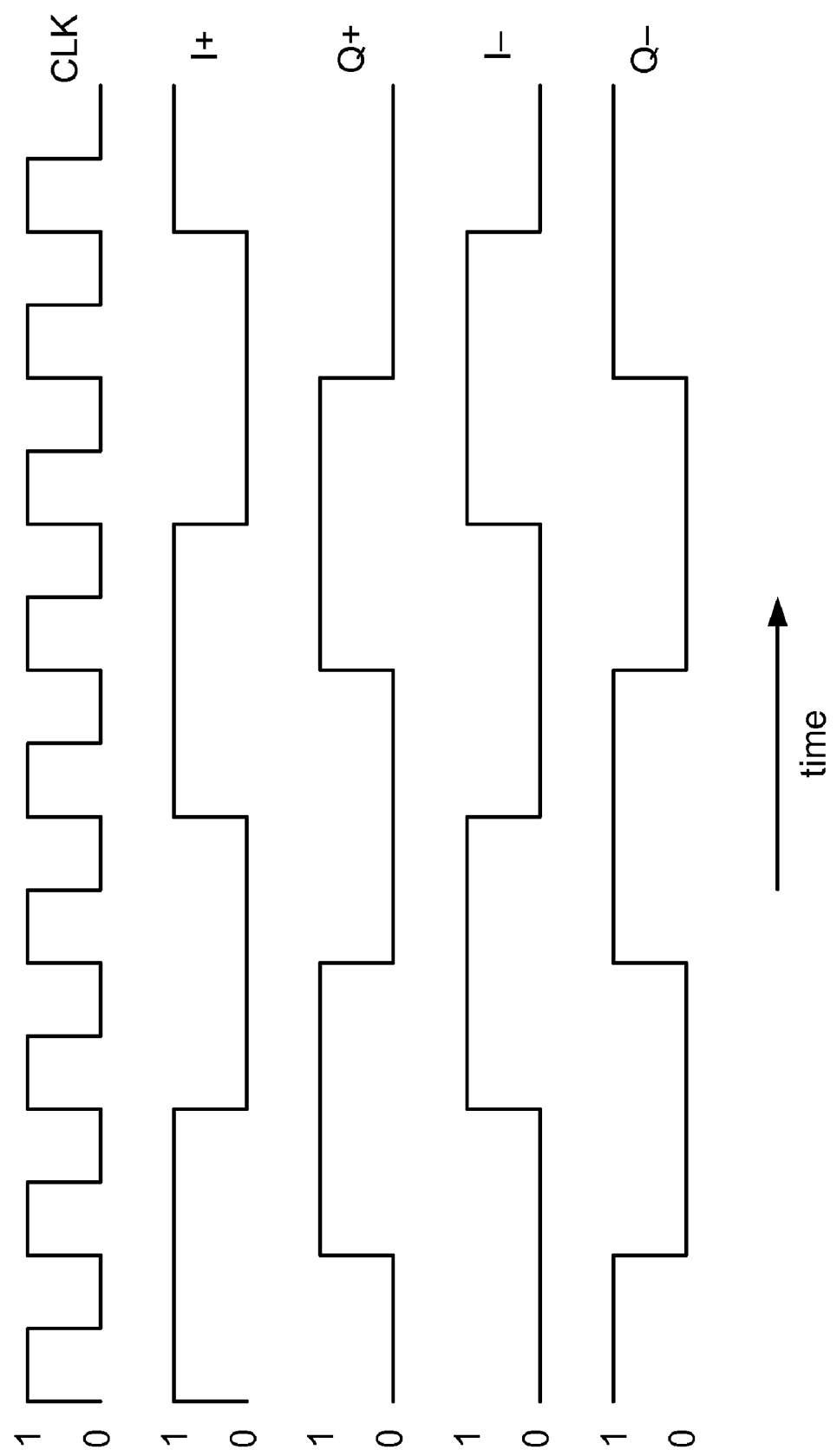
FIG. 3 shows a diagram of a quadrature set of local oscillator signals.

FIG. 3 shows a diagram of a typical set of quadrature local oscillator signals. The I+ and Q+ signals are 90 degrees out of phase, and each one has a complement (I−, Q−) that is 180 degrees out of phase. In this example, each of the four LO signals has an amplitude that alternates between 0 and 1 at the local oscillator frequency and according to the phase of the particular signal. The local oscillator signals are typically generated to have a duty cycle substantially close to 50%, which reduces even-order harmonics.

Figure 4:
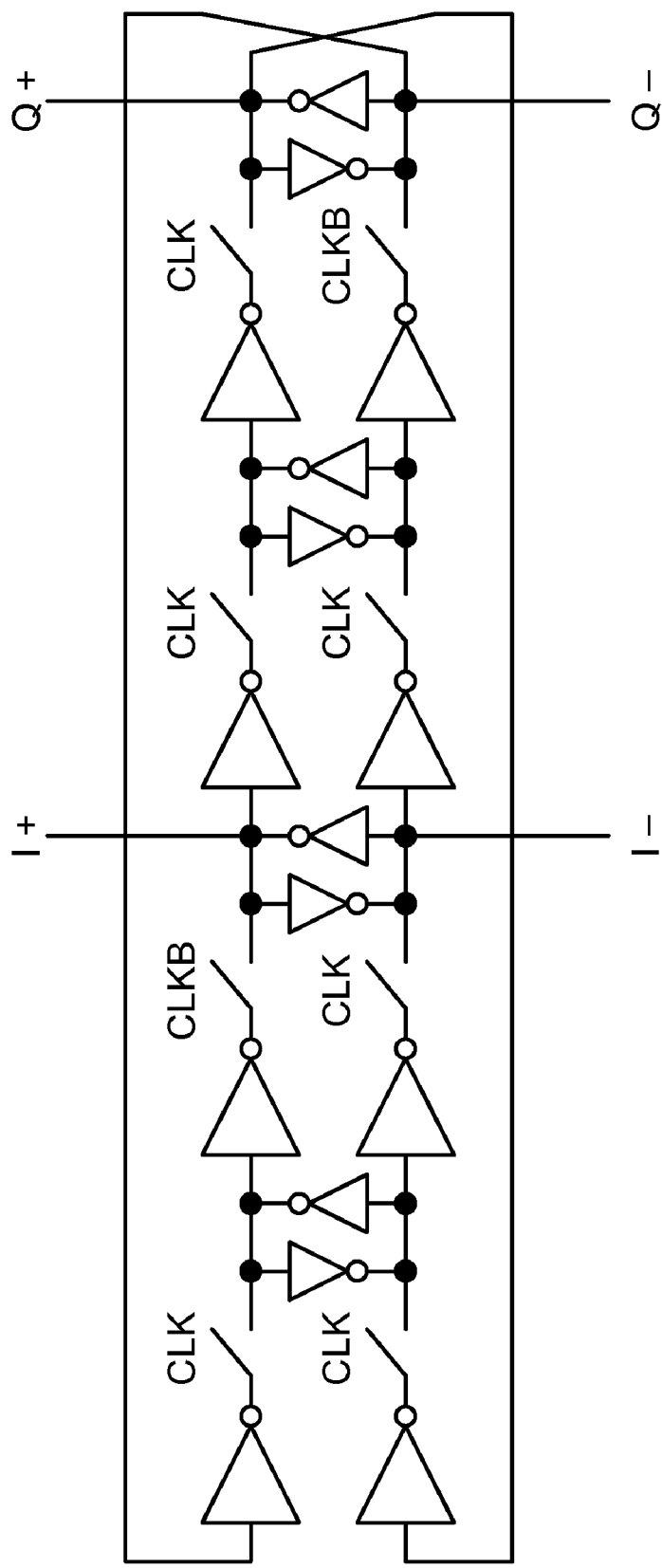
FIG. 4 shows a block diagram of a divide-by-4 counter.

FIG. 4 shows one example of a divide-by-four circuit that may be used to generate a set of quadrature local oscillator signals. This divider takes a differential clock input (a clock signal CLK as shown in FIG. 3 and its complement CLKB) and generates a rail-to-rail differential output for both I and Q channels. As shown in FIG. 4, the divider includes latches that are smaller than the inverters (e.g., four times smaller) and are arranged between the differential paths, which may help to maintain fast signal switching and good differential balance. Divide-by-four circuits including D flip-flops or differential inverters are also known.

Figure 5:
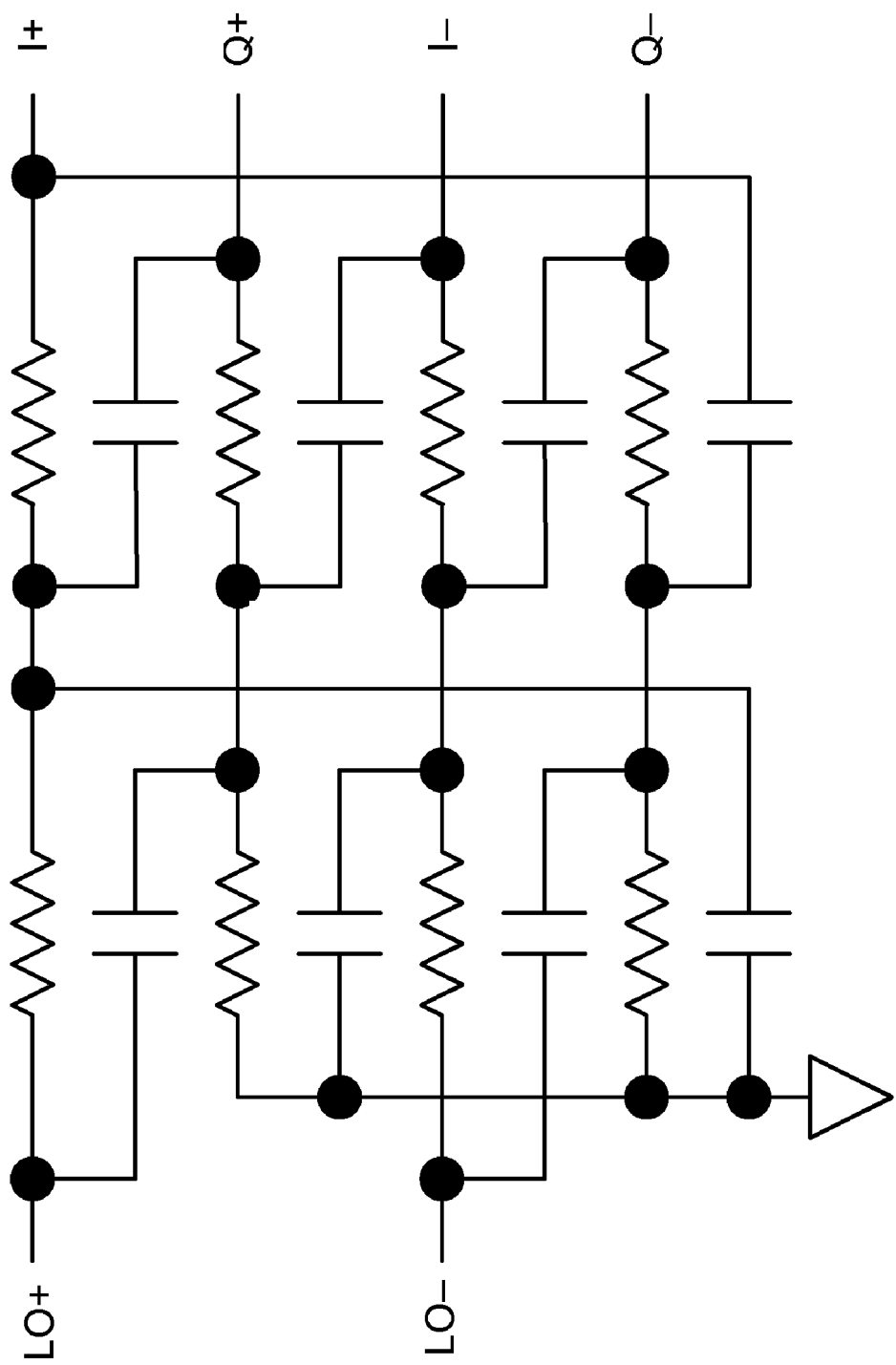
FIG. 5 shows a schematic diagram of a polyphase filter.

In some cases, implementing an oscillator to generate a clock signal running at four times the LO frequency may not be feasible (e.g., in very high frequency or very low power applications) or may otherwise be undesirable. In such cases, another structure such as a polyphase filter or other phase-shift network may be used to generate the set of quadrature LO signals. FIG. 5 shows one example of a second-order polyphase filter configured to generate a set of quadrature local oscillator signals. Examples of other structures that may be used to generate the quadrature LO signals include transmission line structures and opamp-based all-pass networks.

One potential disadvantage of active mixers is 1/f noise, commonly called "flicker noise." The action of switching the RF signal from one switch of a differential pair of a switching mixer to the other does not occur instantaneously, and active mixers generate flicker noise when both switches in a differential pair are on (i.e., the channels of both devices are conducting). This period is called the "crossover point," and it may occur especially at high frequencies when the waveform of the local oscillator becomes rounded rather than square. This flicker noise is visible at the mixer output and is generally proportional to the level of the DC bias current in the switching devices.

Flicker noise has a power spectral density that is inversely proportional to frequency. In a heterodyne architecture, the mixer output frequency is typically far above the range of frequencies in which flicker noise is significant. Because flicker noise dominates at low frequencies, however, it may become a significant problem with homodyne ("zero-IF" or "direct conversion") and low-IF architectures. Flicker noise of the mixer switches is generally the dominant contributor to front-end flicker noise.

Figure 6A:
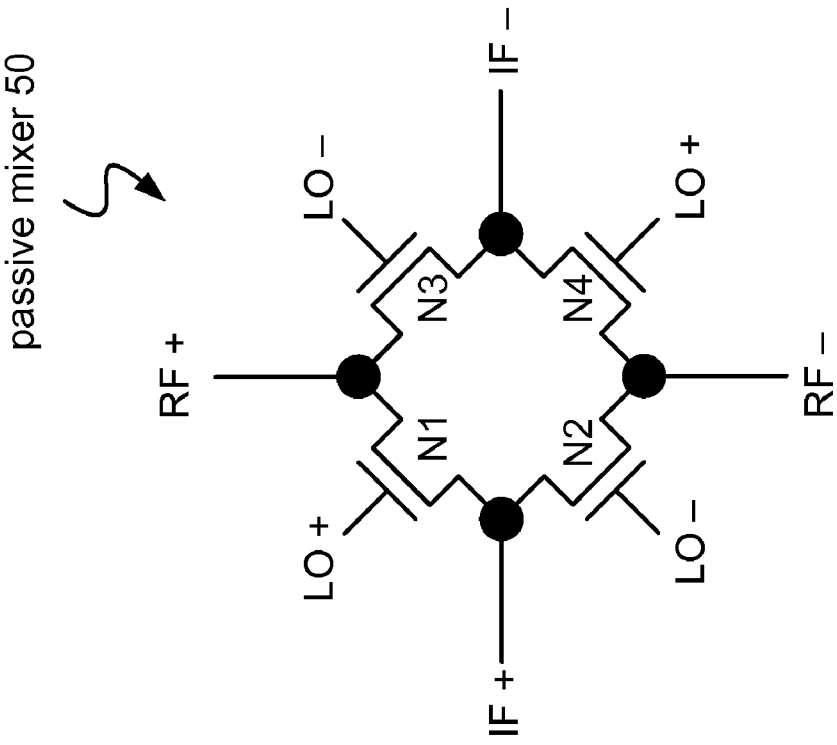
FIG. 6a shows a schematic diagram of a passive mixer.
Figure 6B:
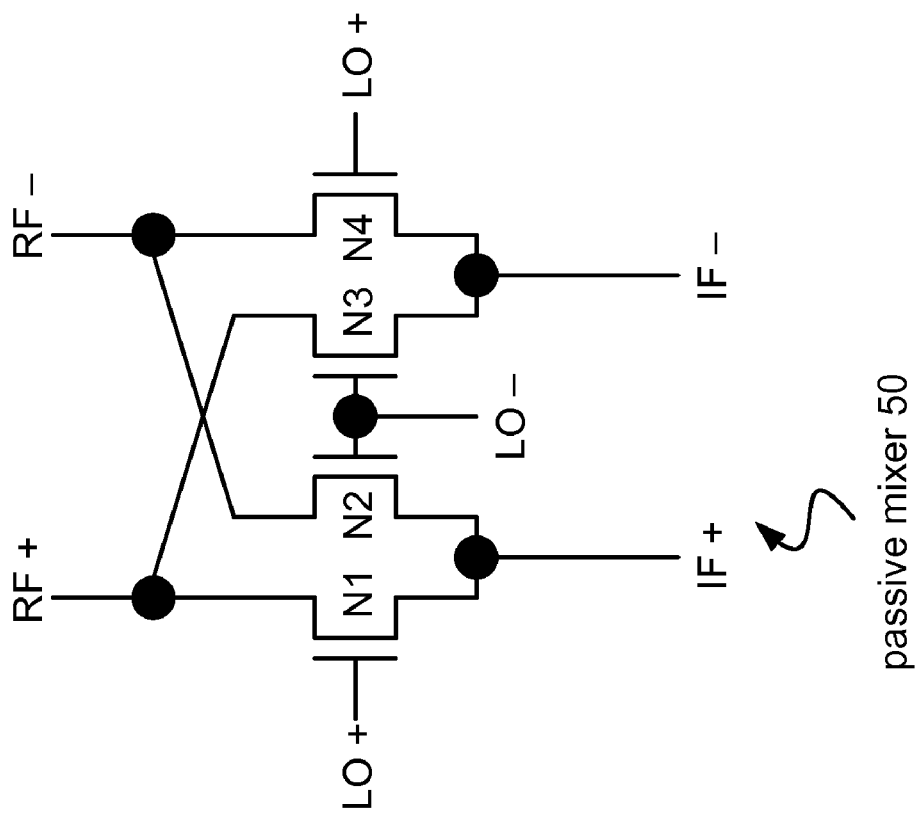

Flicker noise generation in the mixer may be greatly reduced by using a passive mixer rather than an active one. FIG. 6a shows a schematic diagram of a passive mixer that includes four MOSFET switches N1-N4. FIG. 6b shows another diagram of the same circuit that shows its ring structure. Because the channels of the switches of a passive mixer carry substantially no DC current, flicker noise generation by the switches may be largely eliminated, and this feature is a principal advantage of passive mixers in applications that are sensitive to 1/f noise.

The size of the switches in a switching mixer may be optimized according to a desired tradeoff between linearity and matching on one hand, and noise and driving requirements on the other hand. A larger switch will tend to have a lower on-resistance, which improves linearity and matching, but a bigger parasitic capacitance, which increases noise and driving requirements. In one example, the switches N1-N4 of an implementation of a passive mixer are configured to have a W/L ratio in the range of about 300-400 (three hundred to four hundred).

As noted above, passive mixers operate with substantially no bias current and thus typically consume less power and generate much less flicker noise than active mixers. However, passive mixers also have a conversion gain of less than unity (i.e., a conversion loss) such that the output of a passive mixer usually must be amplified. Typically a passive mixer is followed by an amplification stage that may include an operational amplifier (or "opamp"). Unfortunately, opamps contribute both flicker and white noise, with flicker noise dominating at low frequencies (e.g., less than a few MHz for CMOS designs). It is desirable to minimize the level of the noise contribution by the amplification stage.

Figure 7:
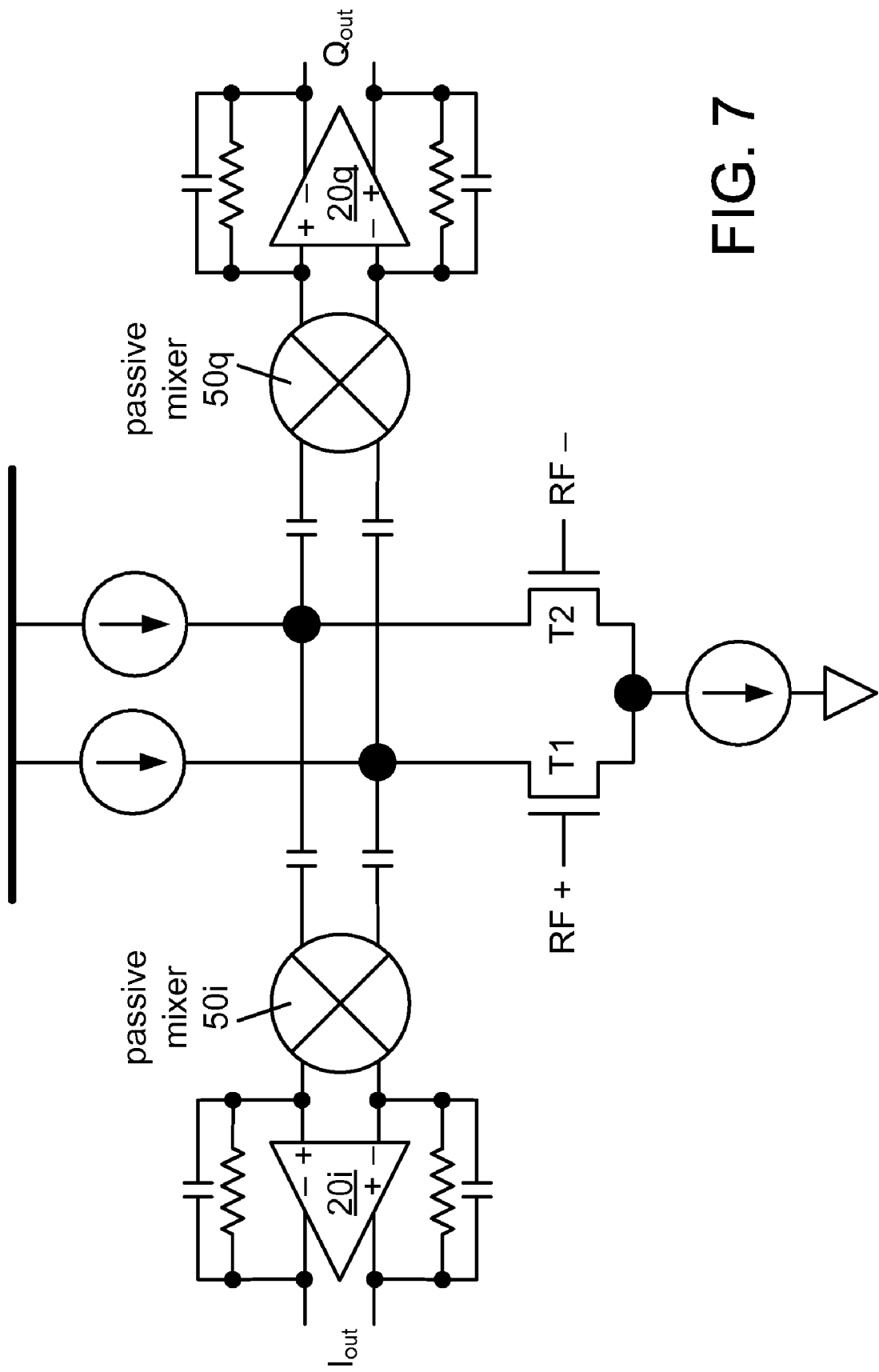
FIG. 7 shows a block diagram of a frequency converter based on a passive current-commutating mixer architecture.

A passive mixer 50 as shown in FIG. 6a,b may be used as a voltage- or current-commutating mixer. FIG. 7 shows an example of a frequency converter based on a current-commutating quadrature mixer architecture that includes two instances 50i,q of passive mixer 50. This architecture has a transconductance stage (including devices T1, T2) that converts the RF voltage signal into a current signal and is AC coupled to the mixers. The local oscillator signals (not shown) may also be AC coupled (capacitively coupled) to the respective mixer switch gates. Each mixer drives a low-impedance load, which in this example is the virtual ground of a respective closed-loop opamp 20i,q. In some cases, each passive mixer 50i,q also has a small capacitor connected across its output terminals (e.g., to remove high-frequency components).

Figure 8:
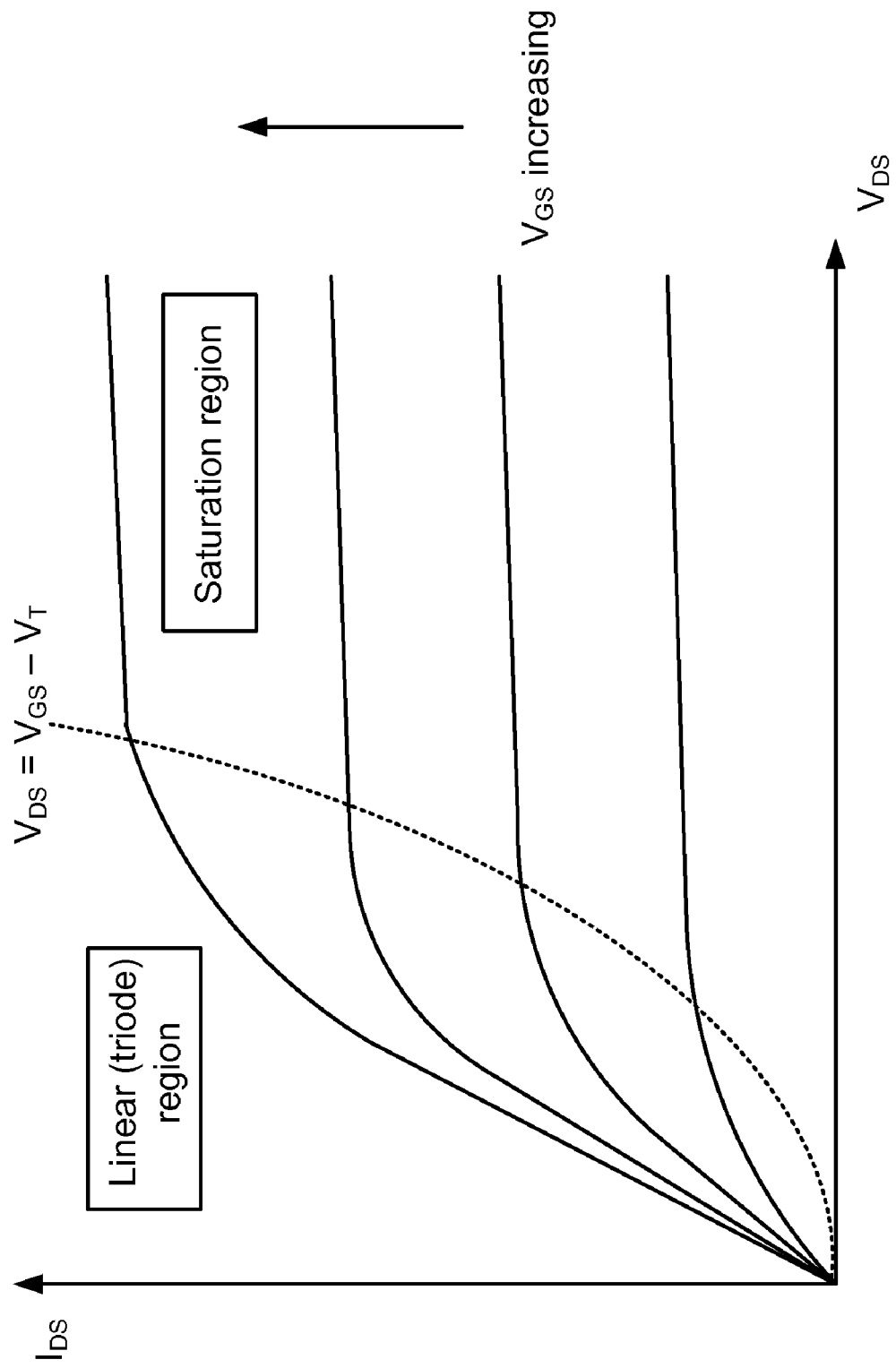
FIG. 8 shows an example of a MOSFET characteristic curve.

FIG. 8 shows an example of a MOSFET characteristic curve, where $I_{DS}$ denotes current between drain and source (i.e., the most positive end and the most negative end, respectively, of the channel regions of an n-channel MOSFET), $V_{DS}$ denotes voltage between drain and source, $V_{GS}$ denotes voltage between gate and source, and $V_T$ denotes the threshold voltage of the device. As may be appreciated from this figure, the impedance of a MOSFET ($dV_{DS}/dI_{DS}$) depends upon the region in which the device is operated. The switches of an active mixer are typically biased to operate in the saturation region, resulting in a high impedance. The switches N1-N4 of a passive mixer are biased near the threshold to operate in the linear (or "triode") region and thus have a low impedance. Unfortunately, the low impedance of the passive mixer switches may lead to several problems. For example, passive mixers typically exhibit higher leakage of the local oscillator signals to the RF stage than active mixers. Local oscillator leakage is a characteristic of an RF device that is typically subject to a regulatory limit (e.g., by the Federal Communications Commission).

Figure 9:
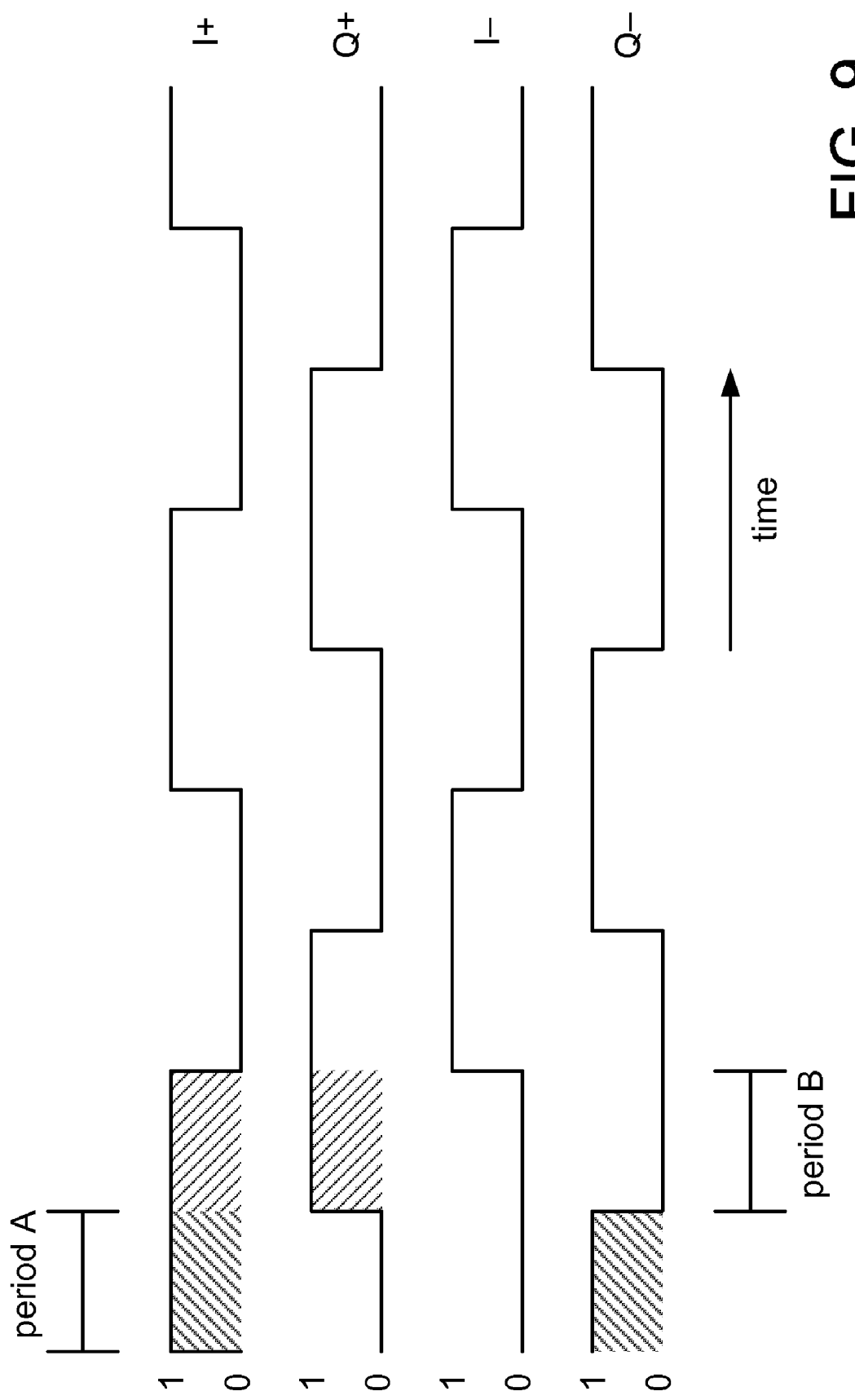
FIG. 9 shows an example of overlap between on-cycles in the set of local oscillator signals of FIG. 3.

Poor isolation between the I and Q channels is another significant problem that may arise with the use of passive mixers in a quadrature frequency converter. As shown in FIG. 3, for example, LO signals having duty cycles of about 50% are commonly used to drive a quadrature pair of switching mixers. One may appreciate from this figure that at any moment, one of the signals I+ and I− is high, and one of the signals Q+ and Q− is high. FIG. 9 illustrates a example of two periods of overlap during an active half-cycle of the signal I+. While the particular pair of active signals changes every quarter-cycle, as a consequence of this overlap, at any moment a switch is on in both of the I and Q mixers.

Figure 10:
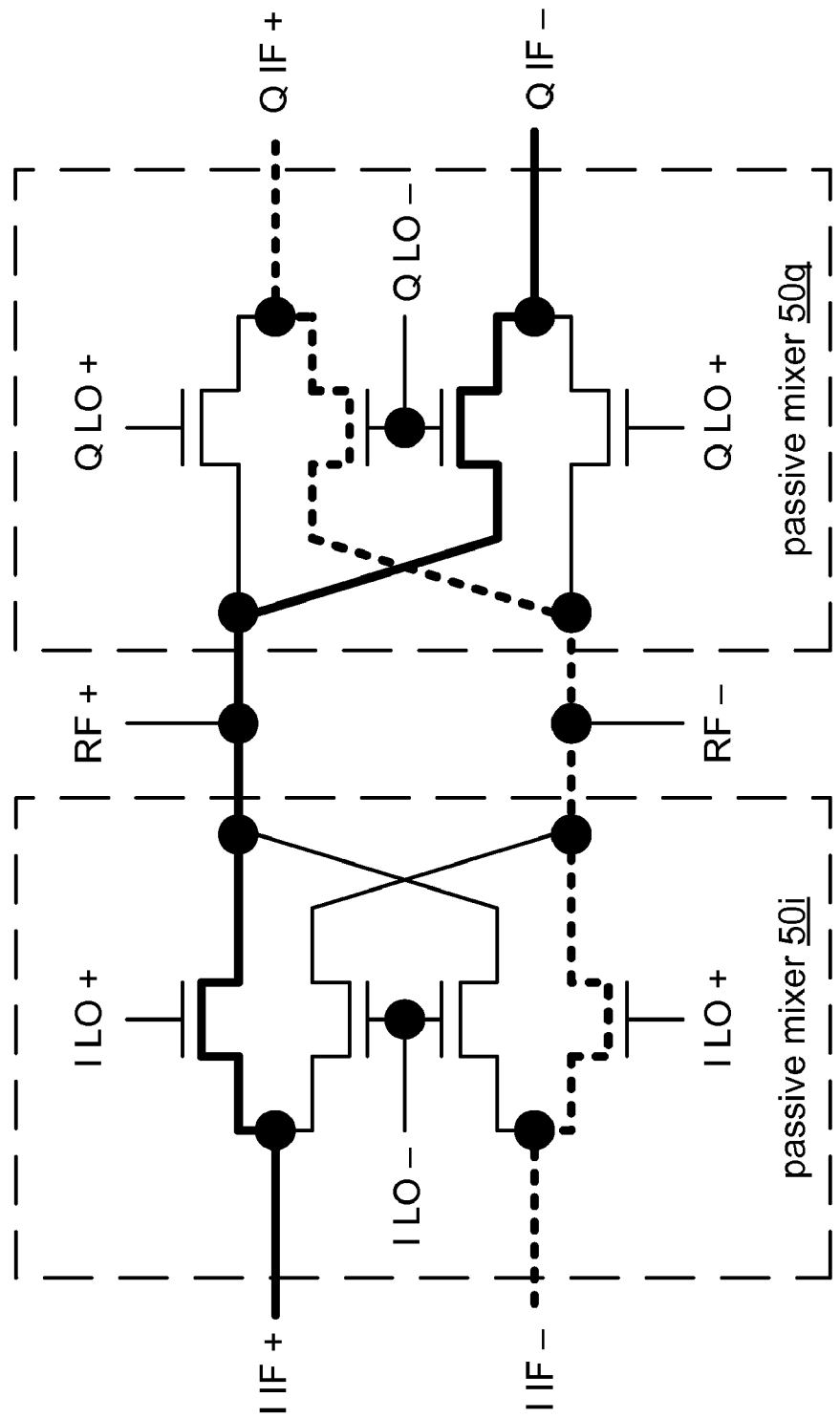
FIG. 10 shows an example of a cross-channel circuit path resulting from the overlap shown in period A of FIG. 9.
Figure 11:
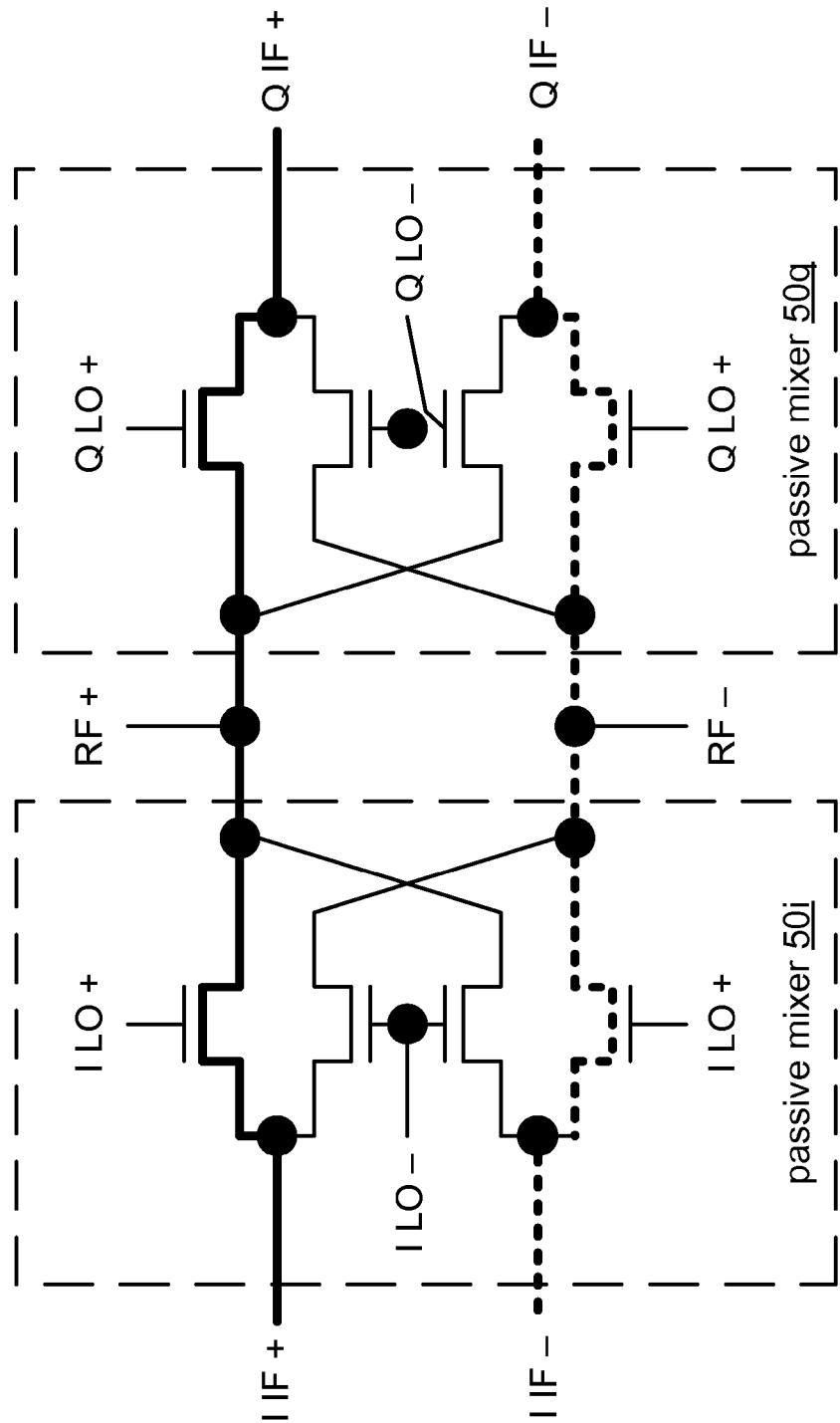
FIG. 11 shows an example of a cross-channel circuit path resulting from the overlap shown in period B of FIG. 9.

Because of the low impedance of the switches in the passive mixers, having switches on both sides open at the same time creates paths between the output terminals of the I mixer and the output terminals of the Q mixer. The bold lines in FIG. 10 show an example of the paths between the I and Q mixer outputs that correspond to overlap period A shown in FIG. 9, and the bold lines in FIG. 11 show an example of the paths between the I and Q mixer outputs that correspond to overlap period B shown in FIG. 9. When the mixers are arranged to drive a low-impedance input (such as the virtual ground of an opamp), one effect of these paths is that each mixer presents a low-impedance output.

The noise current generated by an opamp is inversely proportional to the output impedance of the preceding stage as presented at the opamp input. Consequently, the low output impedance of the passive mixer switch channels in the architecture of FIG. 7 may lead to a higher noise contribution from the opamp stage. A high-impedance input to the opamp may also help to maintain flatness of gain across the bandwidth, while a low impedance between the I and Q channels may lead to upper sideband and lower sideband transfer functions that are asymmetrical near the band edge.

Figure 12:
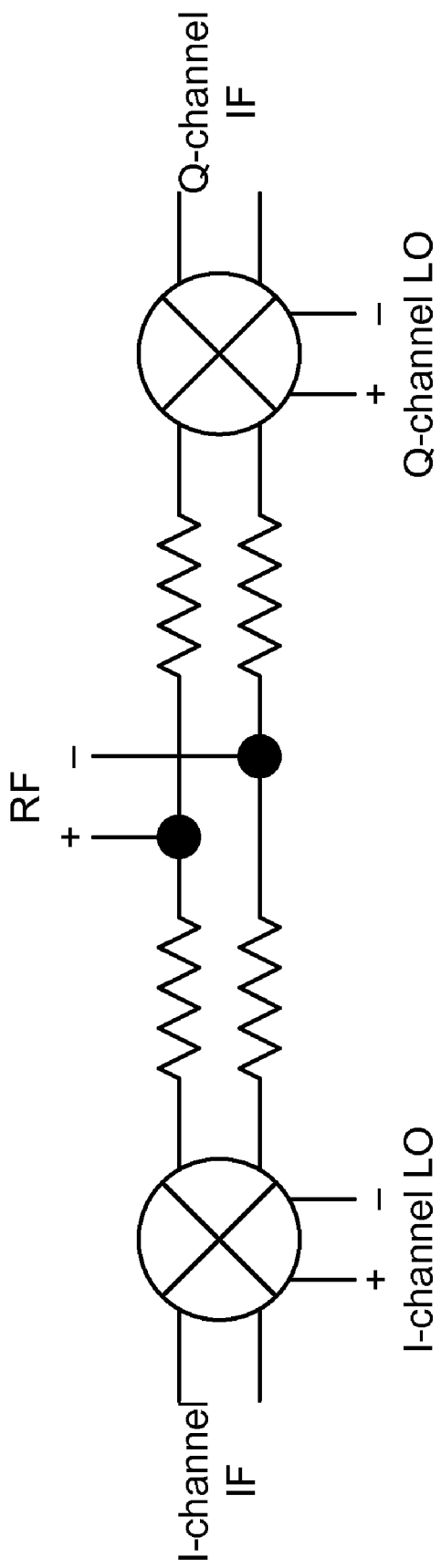
FIG. 12 shows an example of resistive isolation between I and Q mixers.

One approach to avoiding the effects of cross-coupling between the I and Q mixers is to use a splitter to split each side of the differential RF input into two separate paths. While this approach may effectively isolate the mixers from each other, it is likely that a suitable splitter will be an off-chip component, thus increasing manufacturing cost and circuit footprint, while the splitter's insertion loss will further increase the overall conversion loss. As shown in FIG. 12, another approach is to resistively isolate the input terminals of each mixer from the RF input. While such isolation may reduce leakage and cross-coupling of the I and Q mixers, this approach is also less than optimal. Besides the large voltage drop, which reduces voltage headroom and may increase conversion loss, the resistors will also contribute thermal noise.

Figure 13:
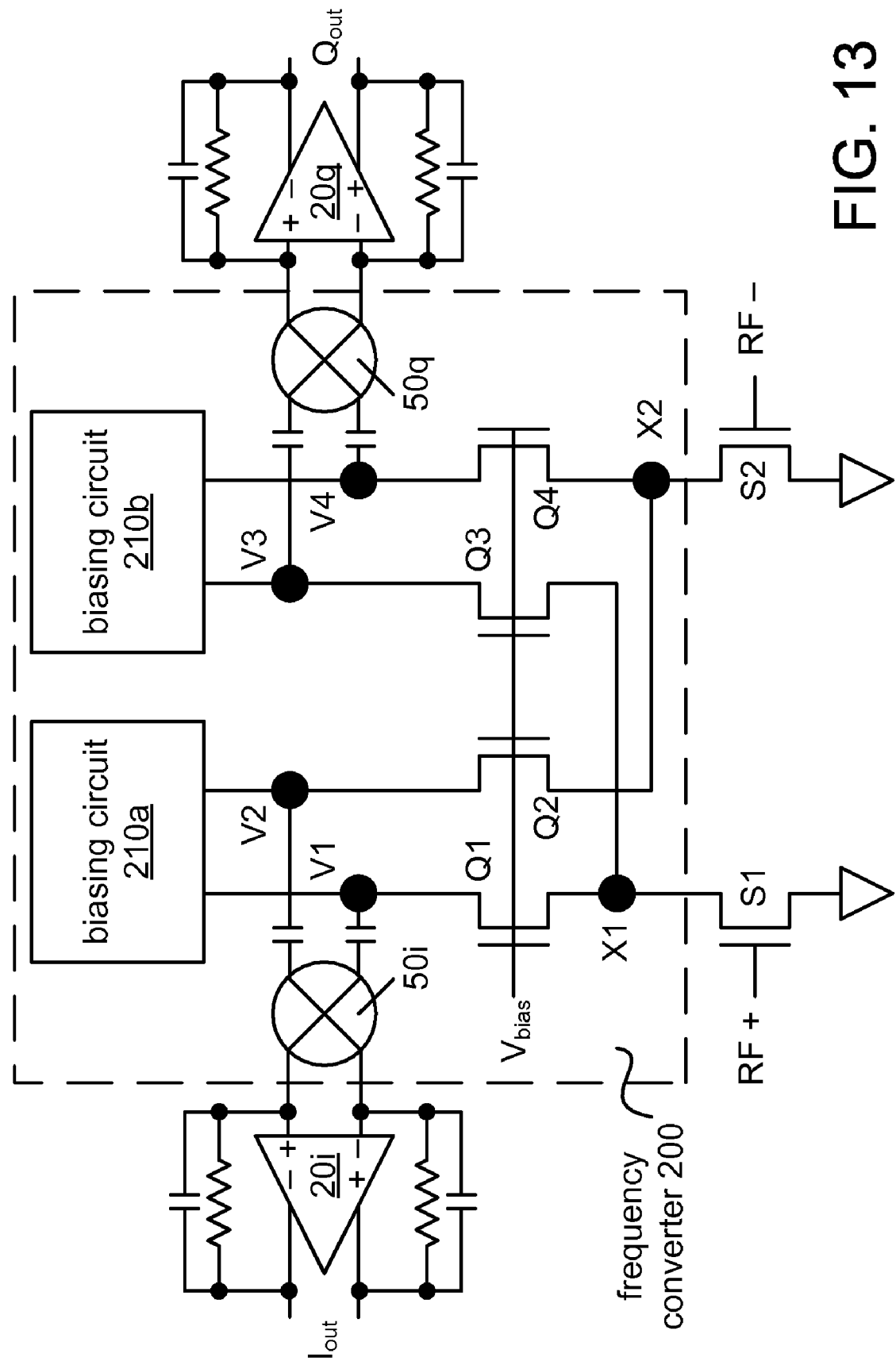
FIG. 13 shows a block diagram of a circuit including a frequency converter 200 according to an embodiment.

FIG. 13 shows an example of a circuit including a frequency converter 200 according to an embodiment that is arranged to receive a differential RF current signal at nodes X1 and X2. Frequency converter 200 includes four transistors Q1-Q4. One side of the channel of each of the transistors Q1, Q2 is connected to a respective one of the input nodes (X1, X2), and the other side is connected to a respective one of the nodes V1, V2. Likewise, one side of the channel of each of the transistors Q3, Q4 is connected to a respective one of the input nodes (X1, X2), and the other side is connected to a respective one of the nodes V3, V4. Typically transistors Q1-Q4 are fabricated to have substantially identical sizes and other characteristics (within process limitations). Each of the nodes V1, V2 is AC coupled (e.g., capacitively coupled) to a respective one of the input terminals of passive mixer 50$i$, and each of the nodes V3, V4 is AC coupled to a respective one of the input terminals of passive mixer 50$q$.

Figure 14:
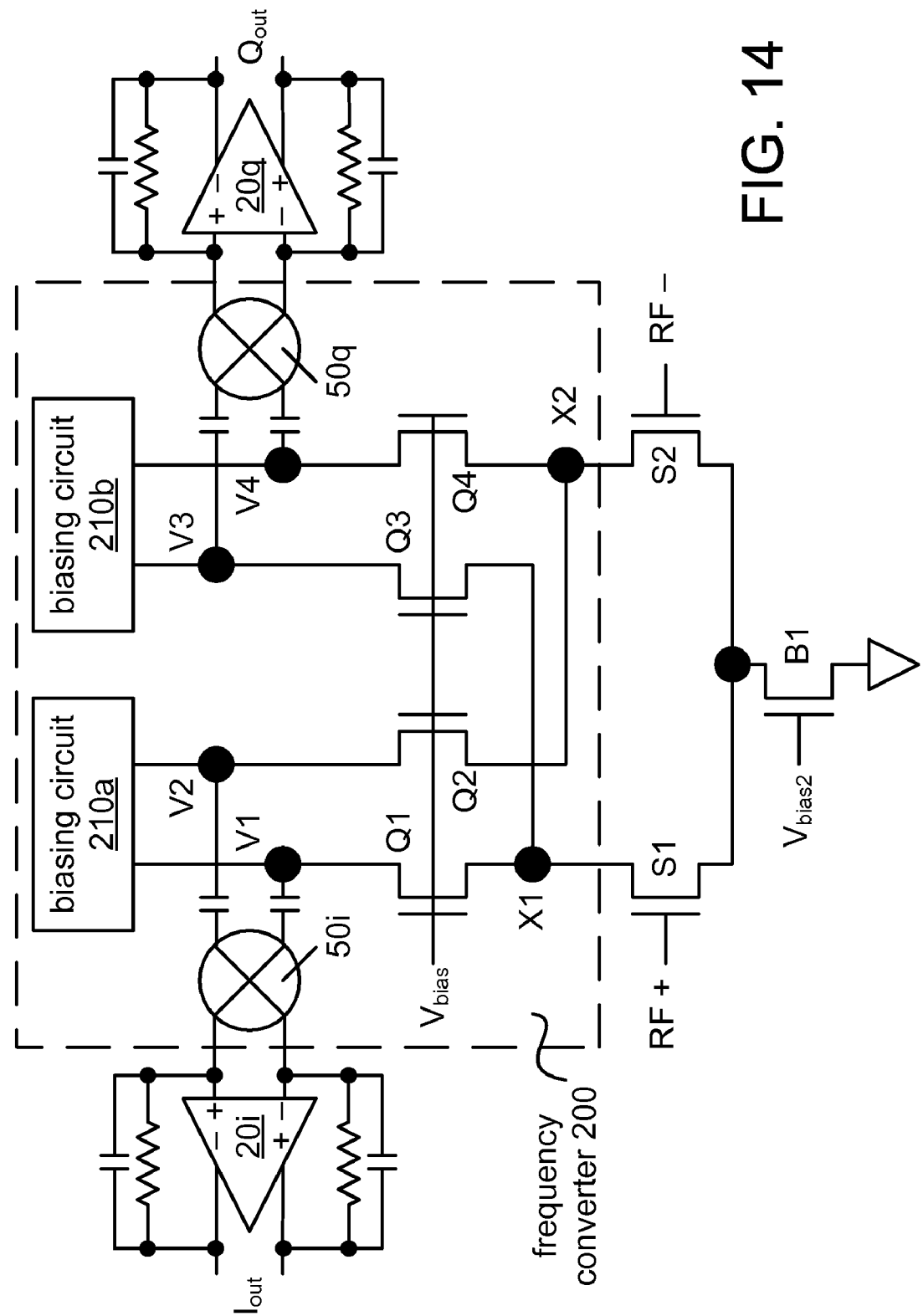
FIG. 14 shows a block diagram of another circuit including frequency converter 200.

In the example of FIG. 13, each of the transistors Q1, Q3 is arranged in a cascode circuit with the RF input transistor S1 that supplies one side of the differential RF current signal to node X1, and each of the transistors Q2, Q4 is arranged in a cascode circuit with the RF input transistor S2 that supplies the other side of the differential RF current signal to node X2. FIG. 14 shows an example of another circuit including frequency converter 200 that also includes a transistor B1 configured to provide a bias current to the RF input transistors S1, S2 according to a DC bias voltage $V_{bias2}$. It may be desirable to bias the RF input transistors S1, S2 and/or the biasing transistor B1 to operate in the saturation region.

FIG. 13 also shows an arrangement in which the output of each passive mixer 50$i,q$ is arranged to drive a respective transimpedance amplifier, such as a differential opamp with feedback 20$i,q$ as described above. Frequency converter 200 may also include two small-valued capacitors, each connected across the output terminals of a respective one of the passive mixers 50$i,q$, that may help to remove high-frequency components.

Frequency converter 200 is arranged to apply a DC bias voltage $V_{bias}$ to the gate of each transistor Q1-Q4 that is sufficient to bias the transistor to operate in the saturation region. Frequency converter 200 may receive the bias voltage $V_{bias}$ from an external source or may include a device or circuit that is configured to generate this bias voltage. By virtue of its operation in the saturation region, each transistor Q1-Q4 is thus configured to provide a high impedance between the RF input node and the mixer input terminal to which it is coupled. This impedance provides isolation between the I and Q mixers and may also reduce LO leakage to the RF stage.

Figure 19B:
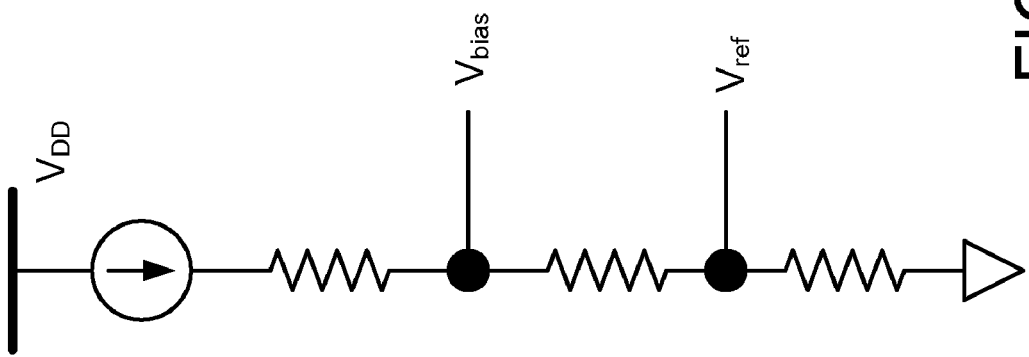
FIGS. 19a and 19b show schematic diagrams of two voltage generation circuits.
Figure 19A:
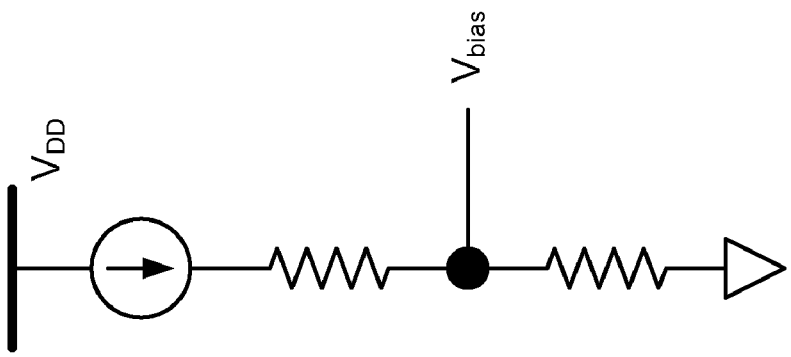

FIG. 19$a$ shows one example of a circuit that may be used to generate $V_{bias}$ and may be included in an implementation of frequency converter 200. This circuit includes a current source and a voltage divider, and the generation of $V_{bias}$ is based on an IR drop (where I denotes DC current and R denotes DC voltage) that results from the source current flowing through the resistors. The value of $V_{bias}$ may be selected according to design criteria such as the level of the source current, the sizes of the devices Q1-Q4, and performance requirements, in addition to the criterion of ensuring the operation of transistors Q1-Q4 in the saturation region.

Frequency converter 200 also includes a biasing circuit 210$a$ arranged to establish offset voltages at the nodes V1 and V2, and a biasing circuit 210$b$ arranged to establish offset voltages at the nodes V3 and V4. These offset voltages provide a bias to the channels of the transistors Q1-Q4 to ensure that these transistors continue to operate in the saturation region. It may be desirable for biasing circuits 210$a$, 210$b$ to present a high impedance to the offset nodes V1-V4 such that the RF current flows into the mixer inputs rather than through the biasing circuits.

In a typical implementation, biasing circuits 210$a,b$ are implemented as substantially identical instances of a biasing circuit 210. These circuits may also be configured such that the voltage at each of the offset nodes V1-V4 is substantially equal to a common voltage $V_{offset}$, although small differences among the actual offset voltages may occur due to process variations, for example. The value of $V_{offset}$ may be selected according to design criteria of the particular application (such as linearity), in addition to the criterion of ensuring the operation of transistors Q1-Q4 in the saturation region.

Figure 15:
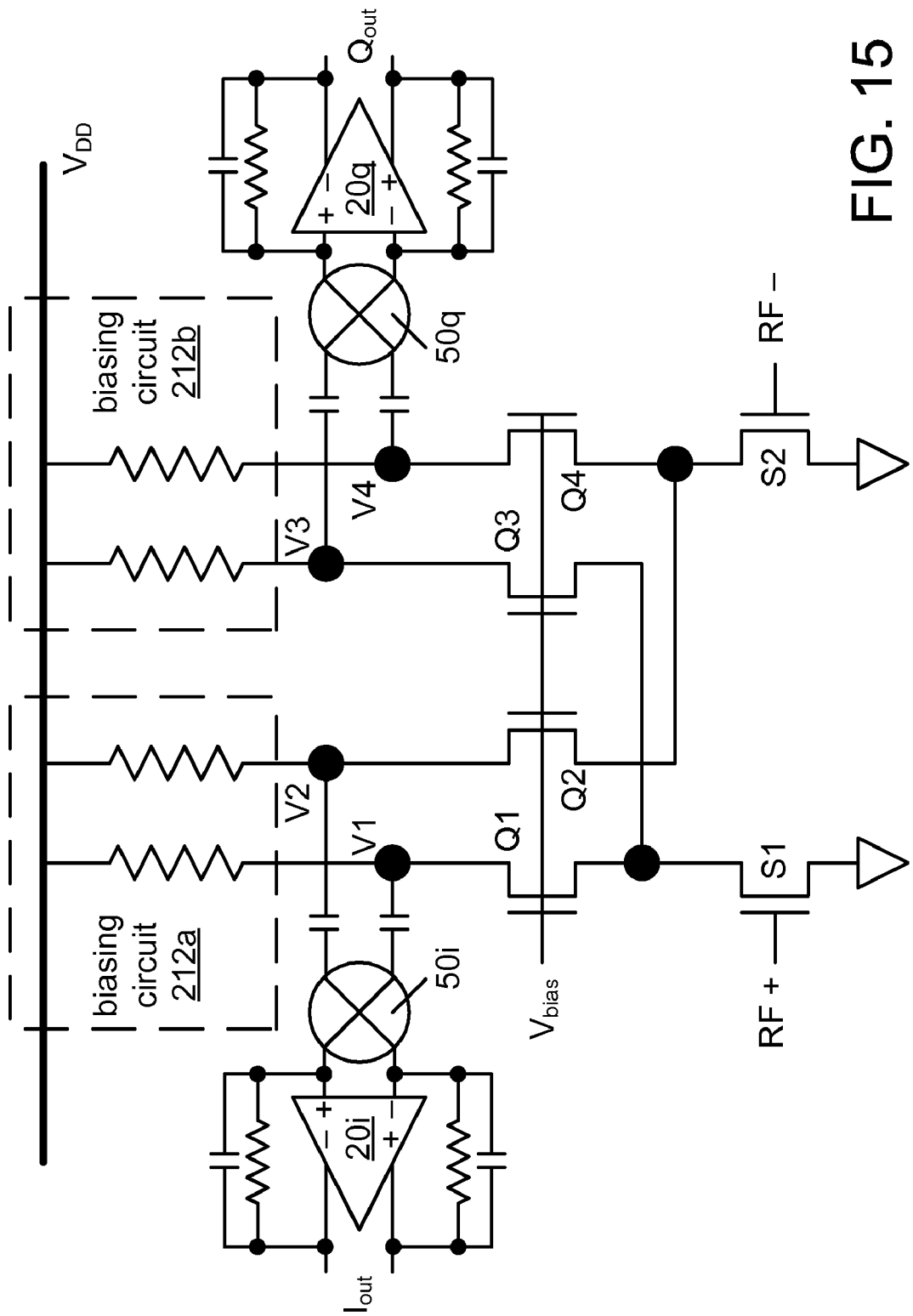
FIG. 15 shows a block diagram of a circuit including an implementation of frequency converter 200.

FIG. 15 shows an implementation of frequency converter 200 that includes implementations 212$a,b$ of biasing circuit 210. In this example, each biasing circuit 212$a,b$ includes two resistive loads, one between the $V_{DD}$ power supply rail and each offset node. A high-impedance resistive load, however, will cause a correspondingly large voltage drop, and such an implementation of biasing circuit 210 may cause a voltage drop that is too high to reliably maintain operation of transistors Q1-Q4 in the saturation region.

Figure 16:
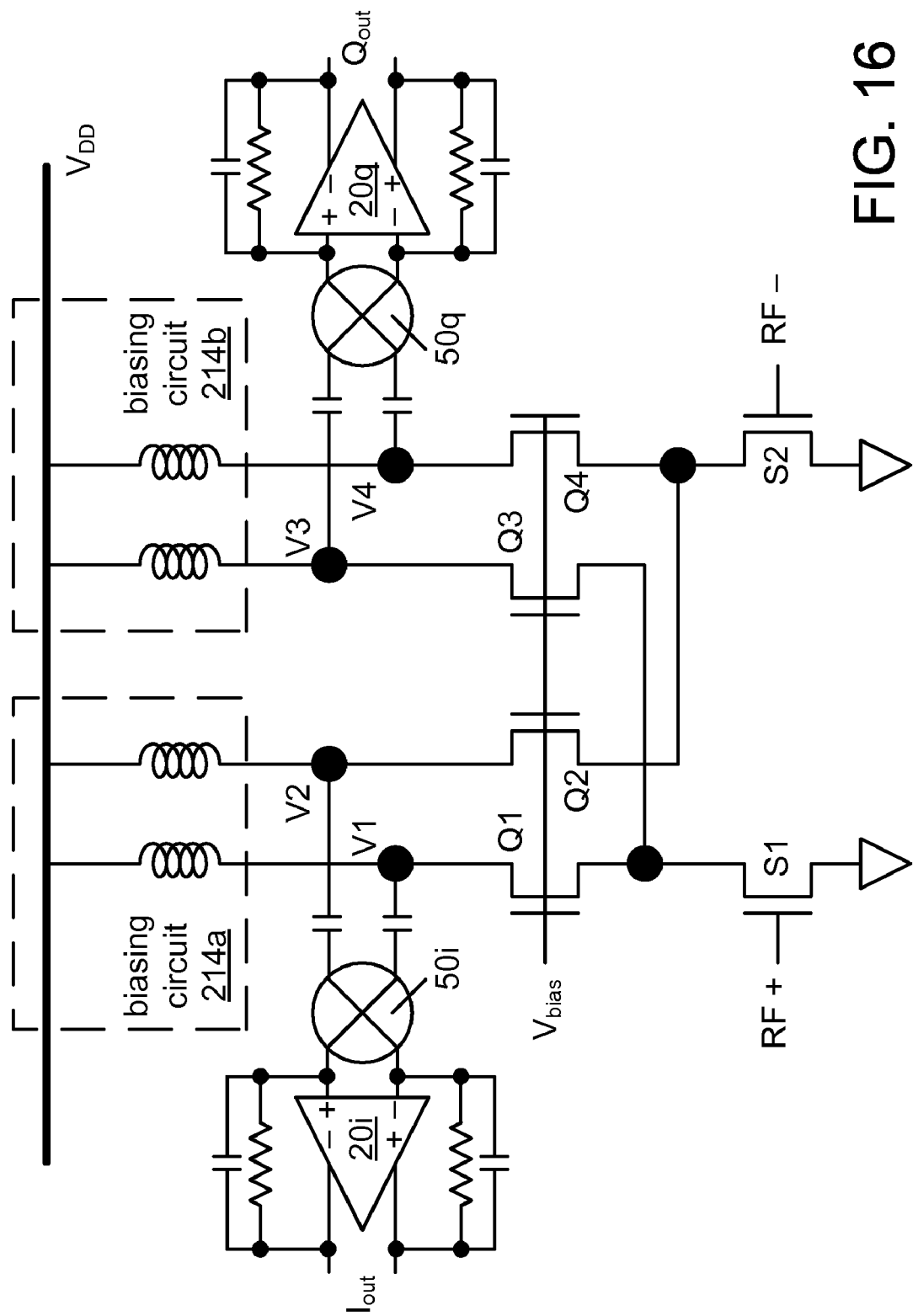
FIG. 16 shows a block diagram of a circuit including another implementation of frequency converter 200.

FIG. 16 shows an implementation of frequency converter 200 that includes implementations 214$a,b$ of biasing circuit 210. In this example, each biasing circuit 214$a,b$ includes two inductive loads, one between the $V_{DD}$ power supply rail and each offset node. The value of each inductor may be chosen to resonate with the parasitic capacitance at output loads. In a further implementation, each instance of biasing circuit 210 is implemented to include two RC circuits, one between the V$DD$ power supply rail and each offset node. Biasing circuit 210 may also be implemented using other arrangements of passive components.

Figure 17:
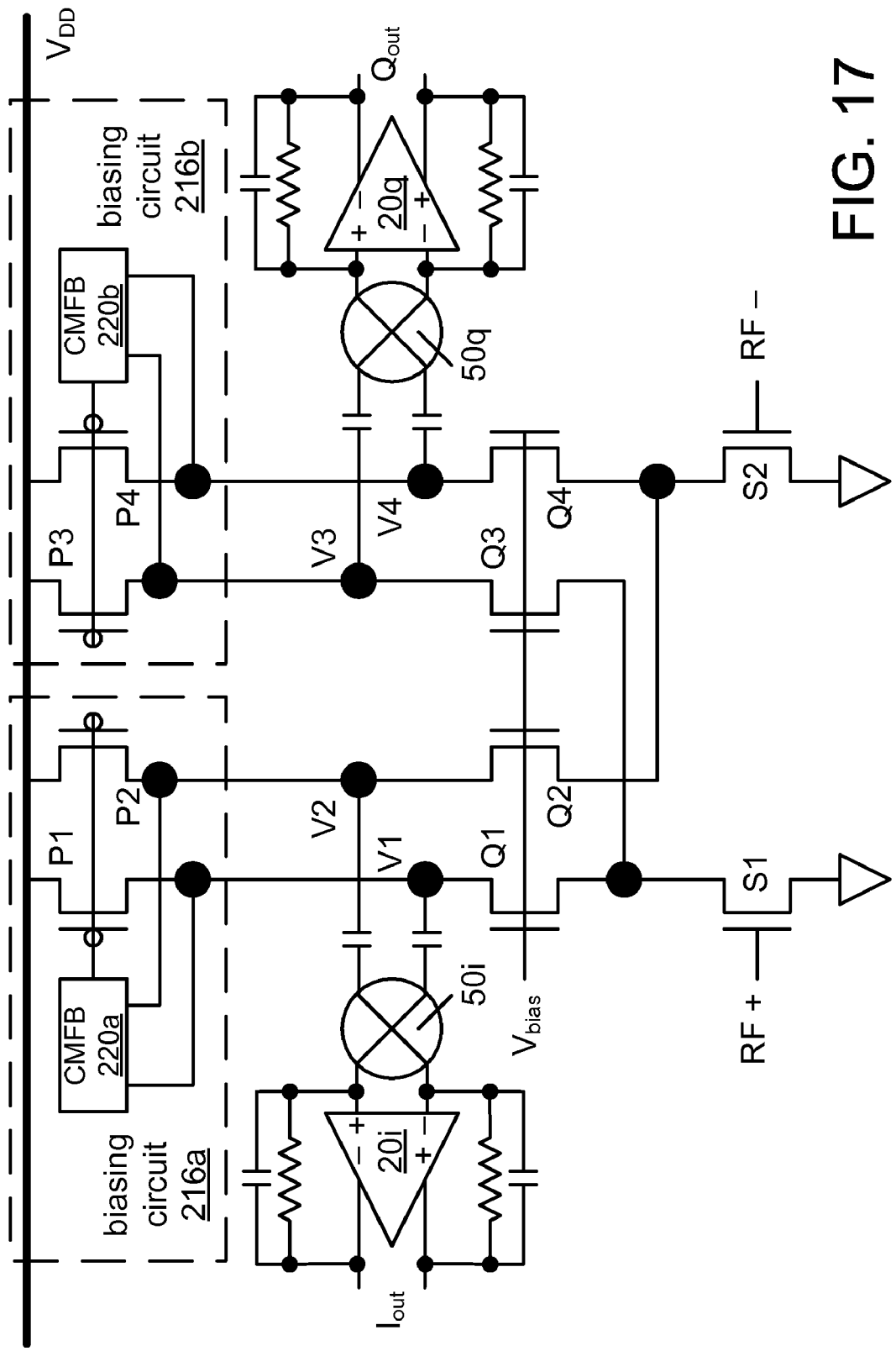
FIG. 17 shows a block diagram of a circuit including a further implementation of frequency converter 200.

It may be desired to implement the biasing circuits using active devices instead of, or in addition to, passive components. FIG. 17 shows an implementation of frequency converter 200 that includes implementations 216$a,b$ of biasing circuit 210. In this example, biasing circuit 216$a$ includes two p-channel MOS (PMOS) transistors P1, P2 configured as active loads, and biasing circuit 216$b$ also includes two PMOS transistors P3, P4 configured as active loads. Each biasing circuit 216$a,b$ also includes a respective instance 220$a,b$ of a common-mode feedback (CMFB) circuit 220 that is configured to bias the two PMOS transistors to operate in the saturation region. It may therefore be desirable to select a value of $V_{offset}$ such that the PMOS transistors and transistors Q1-Q4 may all be biased to operate in the saturation region.

As noted above, the particular voltage or voltages at the offset nodes may be selected according to any set of design criteria that include maintaining operation of transistors Q1-Q4 in the saturation region. For an implementation of frequency converter 200 that includes implementations of biasing circuit 210 having active devices, one approach to selecting a value for $V_{offset}$ is based on the number of active devices on each side of an offset node in a path from one power supply rail to the other. According to this approach, for example, $V_{offset}$ may be selected to equal $2V_{DD}/3$ in the arrangement shown in FIG. 17. This value corresponds to the ratio between (A) the number of active devices in the shortest path from the $V_{SS}$ power supply rail to an offset node (2: e.g., transistors S1 and Q1 in the path of least resistance to node V1) and (B) the number of active devices in the shortest path through the offset node from the $V_{SS}$ power supply rail to the $V_{DD}$ power supply rail (3: e.g. transistors S1, Q1, and P1 in the path of least resistance through node V1). Depending on factors such as the particular fabrication process, $V_{DD}$ may have a value from the following list of examples: 1.2V, 1.55V, 1.8V, 2V, 2.1V, 2.7V, 3V.

Figure 18:
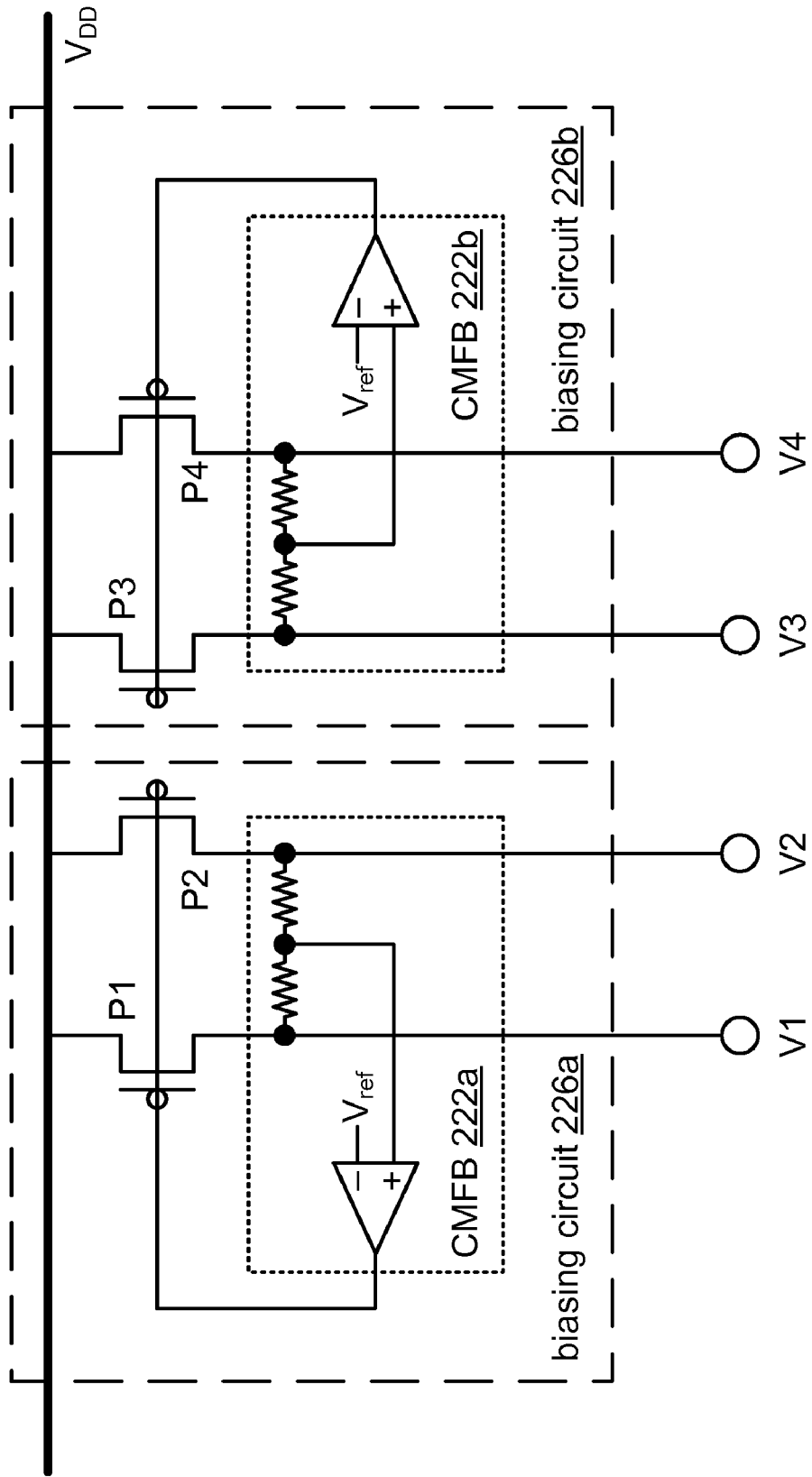
FIG. 18 shows a block diagram of two instances 226a, 226b of an implementation 226 of biasing circuit 216.

Common-mode feedback circuit 220 is arranged to bias the two PMOS transistors of biasing circuit 216 such that the common-mode voltage at the output of the corresponding side of the transconductance stage is set to a known value. Otherwise this common-mode voltage may be undefined. FIG. 18 shows two instances 226a, 226b of an implementation 226 of biasing circuit 216, each including an instance 222a, 222b of an implementation 222 of CMFB circuit 220. Common-mode feedback circuit 222 includes a voltage-sensing circuit (e.g., a voltage divider) arranged to sense the common-mode voltage, and a comparator (e.g., an opamp or other amplifier) configured to bias the two PMOS transistors such that the common-mode voltage is remains substantially equal to a reference voltage $V_{ref}$, which may be zero volts or some other value.

FIG. 19b shows one example of a circuit that may be used to generate $V_{bias}$ and $V_{ref}$ and may be included in an implementation of frequency converter 200. This circuit includes a current source and a voltage divider, and the generation of $V_{bias}$ and $V_{ref}$ is based on IR drops (where I denotes DC current and R denotes DC voltage) that result from the source current flowing through the resistors. As noted above, the value of $V_{bias}$ may be selected according to design criteria such as the level of the source current, the sizes of the devices Q1-Q4, and performance requirements, in addition to the criterion of ensuring the operation of transistors Q1-Q4 in the saturation region. The arrangement in FIG. 19b is only an example, and $V_{ref}$ may be equal to or larger than $V_{bias}$ in some applications.

Figure 20:
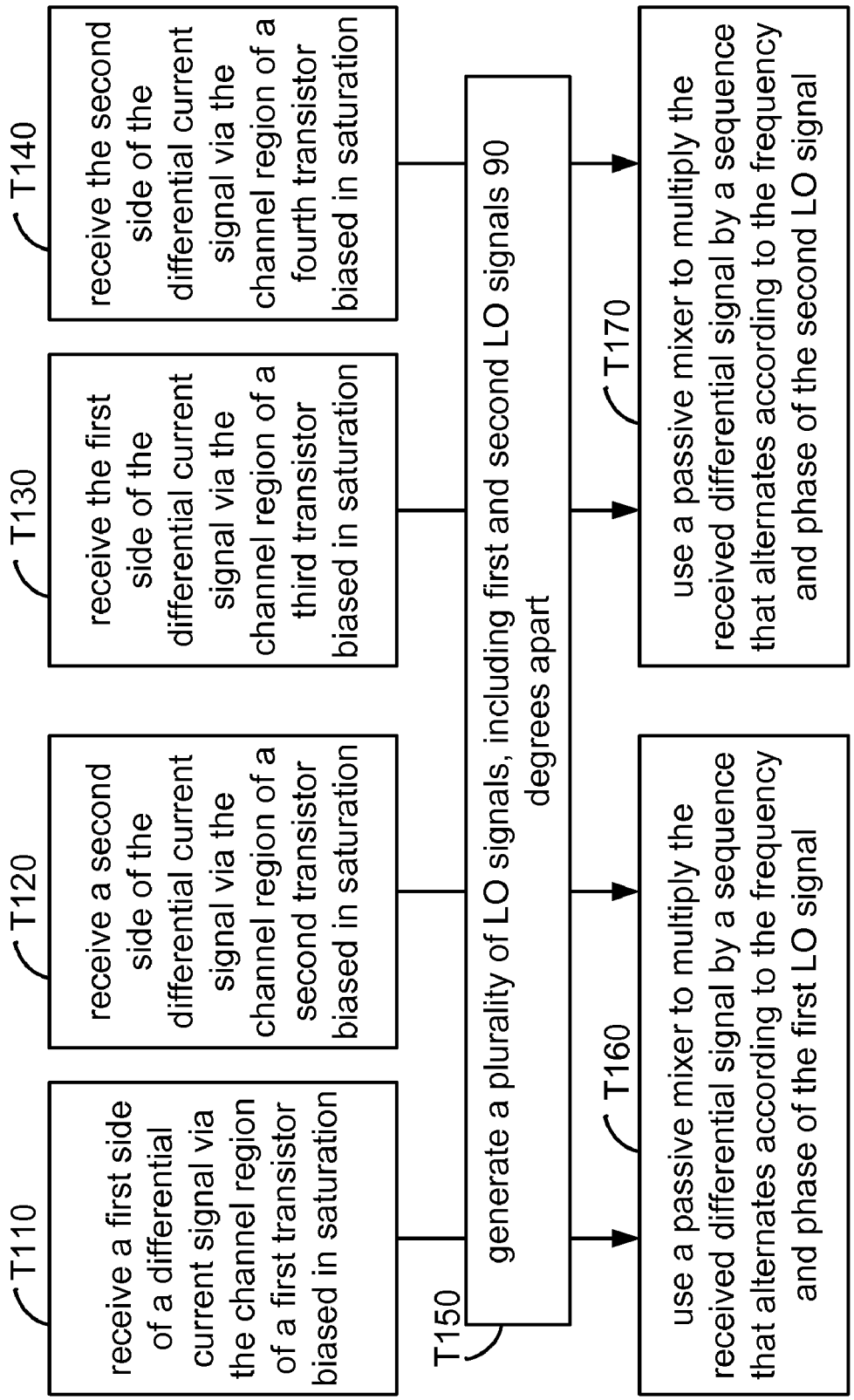
FIG. 20 shows a flowchart of a method according to an embodiment.

FIG. 20 shows a flowchart of a method M100 of frequency conversion according to an embodiment. Task T110 receives a first side of a differential current signal via the channel region of a first transistor biased in the saturation region. Task T120 receives a second side of the differential current signal via the channel region of a second transistor biased in the saturation region. Task T130 receives the first side of the differential current signal via the channel region of a third transistor biased in the saturation region. Task T140 receives the second side of the differential current signal via the channel region of a fourth transistor biased in the saturation region. Task T150 generates a plurality of LO signals that includes a first LO signal and a second LO signal having a phase difference of substantially 90 degrees with respect to the first LO signal. Task T160 uses a passive mixer to multiply the received differential current signal by a sequence that alternates according to the frequency and phase of the first LO signal. Task T170 uses a passive mixer to multiply the received differential current signal by a sequence that alternates according to the frequency and phase of the second LO signal. It is noted that further versions of method M100, as well as additional methods, are expressly disclosed herein by descriptions of the operations of structural embodiments such as frequency converters.

The foregoing presentation of the described embodiments is provided to enable any person skilled in the art to make or use the present invention. Various modifications to these embodiments are possible, and the generic principles presented herein may be applied to other embodiments as well. For example, an embodiment may be implemented in part or in whole as a hard-wired circuit, as a circuit configuration fabricated into an application-specific integrated circuit, or as a firmware program loaded into non-volatile storage or a software program loaded from or into a data storage medium (such as semiconductor or other volatile or nonvolatile memory, or magnetic and/or optical media such as a disk) as machine-readable code, such code being instructions executable by an array of logic elements such as a microprocessor or other digital signal processing unit or finite state machine.

Examples of wireless communications applications that use frequency conversion include portable devices for wireless communications, such as cellular telephones, personal digital assistants (PDAs), pagers, portable e-mail devices (such as the Blackberry™), and satellite devices for consumer and other uses (e.g., GPS receivers, subscription music receivers, television receivers). Other examples of devices for wireless communications include devices configured to communicate over wireless local-area and/or personal-area networks, such as a device compliant with a version of one or more specifications such as IEEE standard 802.11a, 802.11b, and/or 802.11n; IEEE standard 802.15.4 (also called ZigBee™); and IEEE standard 802.15.1 (Bluetooth™); and/or an ultra-wideband (UWB) device. Embodiments include methods and structures as disclosed herein that are configured for use with any such examples.

An implementation of a frequency converter as described herein may be embodied in a chip, possibly as part of a larger circuit that may include an input stage (e.g., RF input transistors S1, S2), an output stage (e.g., transimpedance amplifiers such as opamps 20i,q), and/or a quadrature local oscillator signal generator. Such a chip may also include other circuitry for signal reception and/or transmission, such as a low-noise amplifier, a power amplifier, a modulator, a demodulator, and/or a digital signal processor. Embodiments also include specifications in a hardware description language (such as a variety of Verilog or VHDL) of structures disclosed herein, and consumer electronic devices (e.g. cellular telephones) including one or more such structures. Thus, the present invention is not intended to be limited to the embodiments shown above but rather is to be accorded the widest scope consistent with the principles and novel features disclosed in any fashion herein.

What is claimed is:

1. An apparatus including a frequency converter, said frequency converter comprising:
   a first passive mixer having first and second input terminals;
   a second passive mixer having first and second input terminals; and
   first, second, third, and fourth transistors, each of the four transistors having a gate and a channel region that is proximate to the gate and has two ends,
   wherein the channel regions of the first and third transistors are coupled in series between the first input terminal of the first passive mixer and the first input terminal of the second passive mixer, and wherein the channel regions of the second and fourth transistors are coupled in series between the second input terminal of the first passive mixer and the second input terminal of the second passive mixer, and wherein the first input terminal of the first passive mixer is arranged to receive one side of a differential radio-frequency current signal via the channel region of the first transistor, and the second input terminal of the first passive mixer is arranged to receive the other side of the differential radio-frequency current signal via the channel region of the second transistor, and wherein the first input terminal of the second passive mixer is arranged to receive one side of the differential radio-frequency current signal through the channel region of the third transistor, and the second input terminal of the second passive mixer is arranged to receive the other side of the differential radio-frequency current signal through the channel region of the fourth transistor.

2. The apparatus according to claim 1, wherein the first input terminal of the first passive mixer is capacitively coupled to the channel region of the first transistor, and wherein the first input terminal of the second passive mixer is capacitively coupled to the channel region of the third transistor.

3. The apparatus according to claim 1, said frequency converter comprising first and second input transistors, each having a gate and a channel region that is proximate to the gate and has two ends, wherein the gate of the first input transistor is arranged to receive one side of a differential radio-frequency voltage signal and the gate of the second input transistor is arranged to receive the other side of the differential radio-frequency voltage signal, and wherein one end of the channel region of the first input transistor is connected to a first node and one end of the channel region of the second input transistor is connected to a second node.

4. The apparatus according to claim 1, wherein each of the first and second passive mixers comprise:

two output terminals;

a first differential pair of transistors, each transistor of the pair having a gate and a channel region that is proximate to the gate and has two ends, one end of the channel region of each transistor of the pair being connected to the first input terminal of the mixer and the other end of the channel region of each transistor of the pair being connected to a respective one of the two output terminals of the mixer; and a second differential pair of transistors, each transistor of the pair having a gate and a channel region that is proximate to the gate and has two ends, one end of the channel region of each transistor of the pair being connected to the second input terminal of the mixer and the other end of the channel region of each transistor of the pair being connected to a respective one of the two output terminals of the mixer.

5. The apparatus according to claim 1, said frequency converter comprising a circuit configured to generate a plurality of local oscillator (LO) signals that includes a first LO signal and a second LO signal having a phase difference, with respect to the first LO signal, substantially equal to ninety degrees, and wherein the first passive mixer is configured to multiply the differential RF current signal by a sequence that alternates, according to a frequency and phase of the first LO signal, between two values of substantially equal amplitude and opposite magnitude, and wherein the second passive mixer is configured to multiply the differential RF current signal by a sequence that alternates, according to a frequency and phase of the second LO signal, between the two values of substantially equal amplitude and opposite magnitude.

6. The apparatus according to claim 1, said frequency converter comprising:

a first biasing circuit configured and arranged to establish (A) a first offset voltage at the end of the channel region of the first transistor opposite to a first node and (B) a second offset voltage, at least substantially equal to the first offset voltage, at the end of the channel region of the second transistor opposite to a second node; and a second biasing circuit configured and arranged to establish (C) a third offset voltage at the end of the channel region of the third transistor opposite to the first node and (D) a fourth offset voltage, at least substantially equal to the third offset voltage, at the end of the channel region of the fourth transistor opposite to the second node.

7. The apparatus according to claim 6, wherein the second biasing circuit is configured to establish the third offset voltage at least substantially equal to the first offset voltage.

8. The apparatus according to claim 6, wherein said first biasing circuit comprises:

(i) a first active device coupled between a power supply rail of said frequency converter and the end of the channel region of the first transistor opposite to the first node; and (ii) a second active device coupled between the power supply rail and the end of the channel region of the second transistor opposite to the second node.

9. The apparatus according to claim 6, wherein said first biasing circuit comprises first and second biasing transistors, each having a gate and a channel region that is proximate to the gate and has two ends, wherein one end of the channel region of each of the first and second biasing transistors is connected to a power supply rail of said frequency converter, the other end of the channel region of the first biasing transistor is connected to the end of the channel region of the first transistor opposite to the first node, and the other end of the channel region of the second biasing transistor is connected to the end of the channel region of the second transistor opposite to the second node.

10. The apparatus according to claim 9, wherein said first biasing circuit comprises a first common-mode feedback circuit connected to the end of the channel region of said first transistor opposite to the first node and to the end of the channel region of said second transistor opposite to the second node, and wherein said first biasing circuit is arranged to apply a first bias voltage to the gates of said first and second biasing transistors.

11. The apparatus according to claim 9, wherein each of said first and second biasing transistors is a p-channel metal-oxide-semiconductor transistor.

12. The apparatus according to claim 1, wherein said frequency converter comprises:

a first transimpedance amplifier arranged to receive a first frequency-converted signal from the first passive mixer; and a second transimpedance amplifier arranged to receive a second frequency-converted signal from the second passive mixer.

13. The apparatus according to claim 12, wherein at least one among said first and second transimpedance amplifiers comprises an operational amplifier.

14. The apparatus according to claim 12, wherein said apparatus is an integrated circuit.

15. The apparatus according to claim 12, wherein said apparatus is a device for wireless communications.

16. The apparatus according to claim 12, wherein said apparatus is a cellular telephone.

17. A computer-readable medium encoded with computer-executable instructions, in a hardware description language, wherein execution of the computer-executable instructions is for emulating a frequency converter comprising:
  a first passive mixer having first and second input terminals;
  a second passive mixer having first and second input terminals; and
  first, second, third, and fourth transistors, each of the four transistors having a gate and a channel region that is proximate to the gate and has two ends,
  wherein the channel regions of the first and third transistors are coupled in series between the first input terminal of the first passive mixer and the first input terminal of the second passive mixer, and
  wherein the channel regions of the second and fourth transistors are coupled in series between the second input terminal of the first passive mixer and the second input terminal of the second passive mixer, and
  wherein the first input terminal of the first passive mixer is arranged to receive one side of a differential radio-frequency current signal via the channel region of the first transistor, and the second input terminal of the first passive mixer is arranged to receive the other side of the differential radio-frequency current signal via the channel region of the second transistor, and
  wherein the first input terminal of the second passive mixer is arranged to receive one side of the differential radio-frequency current signal through the channel region of the third transistor, and the second input terminal of the second passive mixer is arranged to receive the other side of the differential radio-frequency current signal through the channel region of the fourth transistor;
  a first transimpedance amplifier arranged to receive a first frequency-converted signal from the first passive mixer; and
  a second transimpedance amplifier arranged to receive a second frequency-converted signal from the second passive mixer.

18. An apparatus including a frequency converter, said frequency converter having first and second nodes arranged to receive respective sides of a differential radio-frequency current signal, said frequency converter comprising:
  a first passive mixer having first and second input terminals;
  a second passive mixer having first and second input terminals; and
  first, second, third, and fourth transistors, each of the four transistors having a gate and a channel region that is proximate to the gate and has two ends,
  wherein the first input terminal of the first passive mixer is coupled to the first node through the two ends of the channel region of the first transistor, and the second input terminal of the first passive mixer is coupled to the second node through the two ends of the channel region of the first transistor, and
  wherein the first input terminal of the second passive mixer is coupled to the first node through the two ends of the channel region of the third transistor, and the second input terminal of the second passive mixer is coupled to the second node through the two ends of the channel region of the fourth transistor.

19. The apparatus according to claim 18, wherein the first input terminal of the first passive mixer is capacitively coupled to the channel region of the first transistor, and
  wherein the first input terminal of the second passive mixer is capacitively coupled to the channel region of the third transistor.

20. The apparatus according to claim 18, said frequency converter comprising first and second input transistors, each having a gate and a channel region that is proximate to the gate and has two ends,
  wherein the gate of the first input transistor is arranged to receive one side of a differential radio-frequency voltage signal and the gate of the second input transistor is arranged to receive the other side of the differential radio-frequency voltage signal, and
  wherein one end of the channel region of the first input transistor is connected to the first node and one end of the channel region of the second input transistor is connected to the second node.

21. The apparatus according to claim 18, wherein each of the first and second passive mixers has two output terminals and comprises:
  a first differential pair of transistors, each transistor of the pair having a gate and a channel region that is proximate to the gate and has two ends, one end of the channel region of each transistor of the pair being connected to the first input terminal of the mixer and the other end of the channel region of each transistor of the pair being connected to a respective one of the two output terminals of the mixer; and
  a second differential pair of transistors, each transistor of the pair having a gate and a channel region that is proximate to the gate and has two ends, one end of the channel region of each transistor of the pair being connected to the second input terminal of the mixer and the other end of the channel region of each transistor of the pair being connected to a respective one of the two output terminals of the mixer.

22. The apparatus according to claim 18, said frequency converter comprising a circuit configured to generate a plurality of local oscillator (LO) signals that further comprises a first LO signal and a second LO signal having a phase difference, with respect to the first LO signal, substantially equal to ninety degrees, and
  wherein the first passive mixer is configured to multiply the differential RF current signal by a sequence that alternates, according to a frequency and phase of the first LO signal, between two values of substantially equal amplitude and opposite magnitude, and
  wherein the second passive mixer is configured to multiply the differential RF current signal by a sequence that alternates, according to a frequency and phase of the second LO signal, between the two values of substantially equal amplitude and opposite magnitude.

23. The apparatus according to claim 18, said frequency converter comprising:
  a first biasing circuit configured and arranged to establish (A) a first offset voltage at the end of the channel region of the first transistor opposite to the first node and (B) a second offset voltage, at least substantially equal to the first offset voltage, at the end of the channel region of the second transistor opposite to the second node; and
  a second biasing circuit configured and arranged to establish (C) a third offset voltage at the end of the channel region of the third transistor opposite to the first node and (D) a fourth offset voltage, at least substantially equal to the third offset voltage, at the end of the channel region of the fourth transistor opposite to the second node.

24. The apparatus according to claim 23, wherein the second biasing circuit is configured to establish the third offset voltage at least substantially equal to the first offset voltage.

25. The apparatus according to claim 23, wherein said first biasing circuit comprises:
   (i) a first active device coupled between a power supply rail of said frequency converter and the end of the channel region of the first transistor opposite to the first node; and
   (ii) a second active device coupled between the power supply rail and the end of the channel region of the second transistor opposite to the second node.

26. The apparatus according to claim 23, wherein said first biasing circuit comprises first and second biasing transistors, each having a gate and a channel region that is proximate to the gate and has two ends,
   wherein one end of the channel region of each of the first and second biasing transistors is connected to a power supply rail of said frequency converter, the other end of the channel region of the first biasing transistor is connected to the end of the channel region of the first transistor opposite to the first node, and the other end of the channel region of the second biasing transistor is connected to the end of the channel region of the second transistor opposite to the second node.

27. The apparatus according to claim 26, wherein said first biasing circuit comprises a first common-mode feedback circuit connected to the end of the channel region of said first transistor opposite to the first node and to the end of the channel region of said second transistor opposite to the second node, and wherein said first biasing circuit is arranged to apply a first bias voltage to the gates of said first and second biasing transistors.

28. The apparatus according to claim 27, wherein each of said first and second biasing transistors is a p-channel metal-oxide-semiconductor transistor.

29. The apparatus according to claim 18, wherein said frequency converter comprises:
   a first transimpedance amplifier arranged to receive a first frequency-converted signal from the first passive mixer; and
   a second transimpedance amplifier arranged to receive a second frequency-converted signal from the second passive mixer.

30. The apparatus according to claim 29, wherein at least one among said first and second transimpedance amplifiers comprises an operational amplifier.

31. The apparatus according to claim 18, wherein said apparatus is an integrated circuit.

32. The apparatus according to claim 18, wherein said apparatus is a device for wireless communications.

33. The apparatus according to claim 18, wherein said apparatus is a cellular telephone.

34. A method of frequency conversion, said method comprising:
   receiving in a first channel, a first side of a differential current signal via a channel region of a first transistor that is biased to operate in a saturation region;
   receiving a second side of the differential current signal via a channel region of a second transistor that is biased to operate in the saturation region;
   receiving in a second channel, the first side of the differential current signal via a channel region of a third transistor that is biased to operate in the saturation region;
   receiving the second side of the differential current signal via a channel region of a fourth transistor that is biased to operate in the saturation region;
   generating a plurality of local oscillator (LO) signals that includes a first LO signal and a second LO signal having a phase difference, with respect to the first LO signal, substantially equal to ninety degrees;
   using a passive mixer of the first channel to multiply the received differential current signal by a sequence that alternates, according to a frequency and phase of the first LO signal, between two values of substantially equal amplitude and opposite magnitude; and
   using a passive mixer of the second channel to multiply the received differential current signal by a sequence that alternates, according to a frequency and phase of the second LO signal, between the two values of substantially equal amplitude and opposite magnitude.

35. The method of frequency conversion according to claim 34, said method comprising:
   establishing (A) a first DC offset voltage at the end of the channel region of the first transistor opposite to a first node and (B) a second DC offset voltage, at least substantially equal to the first DC offset voltage, at the end of the channel region of the second transistor opposite to a second node; and
   establishing (C) a third DC offset voltage, at least substantially equal to the first DC offset voltage, at the end of the channel region of the third transistor opposite to the first node and (D) a fourth DC offset voltage, at least substantially equal to the third DC offset voltage, at the end of the channel region of the fourth transistor opposite to the second node.

36. The method of frequency conversion according to claim 35, wherein said establishing a first DC offset voltage further comprises biasing a first active device, coupled between a power supply rail and the end of the channel region of the first transistor opposite to the first node, to operate in the saturation region.

37. The method of frequency conversion according to claim 34, said method comprising:
   converting the multiplied current signal of the first channel into a voltage signal; and
   converting the multiplied current signal of the second channel into a voltage signal.

38. The method of frequency conversion according to claim 37, wherein said converting the multiplied current signal of the first channel into a voltage signal comprises using an operational amplifier to convert the multiplied current signal of the first channel into a voltage signal.

* * * * *